(12) United States Patent
Nei et al.

(10) Patent No.: US 8,530,336 B2
(45) Date of Patent: Sep. 10, 2013

(54) METHOD FOR MANUFACTURING SEMICONDUCTOR SUBSTRATE

(75) Inventors: Kosei Nei, Atsugi (JP); Akihisa Shimomura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 82 days.

(21) Appl. No.: 13/292,190

(22) Filed: Nov. 9, 2011

(65) Prior Publication Data

US 2012/0122298 A1   May 17, 2012

(30) Foreign Application Priority Data

Nov. 12, 2010   (JP) ................. 2010-254168

(51) Int. Cl.
*H01L 21/30* (2006.01)
*H01L 21/46* (2006.01)

(52) U.S. Cl.
USPC ............ 438/458; 257/E21.088; 257/E21.122; 257/E21.48; 257/E21.567; 257/E21.568; 257/E21.57; 438/406; 438/409; 438/455; 438/459; 438/487; 438/960

(58) Field of Classification Search
USPC ...................... 257/E21.088, E21.122, E21.48, 257/E21.567, E21.568, E21.57; 438/406, 438/409, 455, 458, 459, 487, 960
See application file for complete search history.

(56) References Cited

U.S. PATENT DOCUMENTS

| | | |
|---|---|---|
| 5,374,564 A | 12/1994 | Bruel |
| 6,110,845 A | 8/2000 | Seguchi et al. |
| 6,127,702 A | 10/2000 | Yamazaki et al. |
| 6,271,101 B1 | 8/2001 | Fukunaga |
| 6,335,231 B1 | 1/2002 | Yamazaki et al. |
| 6,372,609 B1 | 4/2002 | Aga et al. |
| 6,380,046 B1 | 4/2002 | Yamazaki |
| 6,388,652 B1 | 5/2002 | Yamazaki et al. |

(Continued)

FOREIGN PATENT DOCUMENTS

| | | |
|---|---|---|
| EP | 1 983 566 A2 | 10/2008 |
| JP | 11-163363 | 6/1999 |
| JP | 2005-252244 | 9/2005 |
| JP | 2008-288563 | 11/2008 |

OTHER PUBLICATIONS

Kahlert et al., Mat. Res. Soc. Symp. Proc. (Materials Research Society Symposia Proceedings), UV-Optics for Excimer Laser based Crystallization Processes, Jan. 1, 2001, Vol. 685E, pp. D6.2.1-D6.2.6.

*Primary Examiner* — Asok K Sarkar
(74) *Attorney, Agent, or Firm* — Eric J. Robinson; Robinson Intellectual Property Law Office, P.C.

(57) ABSTRACT

Defects in a semiconductor substrate are reduced. A semiconductor substrate with fewer defects is manufactured with high yield. Further, a semiconductor device is manufactured with high yield. A semiconductor layer is formed over a supporting substrate with an oxide insulating layer interposed therebetween, adhesiveness between the supporting substrate and the oxide insulating layer in an edge portion of the semiconductor layer is increased, an insulating layer over a surface of the semiconductor layer is removed, and the semiconductor layer is irradiated with laser light, so that a planarized semiconductor layer is obtained. For increasing the adhesiveness between the supporting substrate and the oxide insulating layer in the edge portion of the semiconductor layer, laser light irradiation is performed from the surface of the semiconductor layer.

18 Claims, 14 Drawing Sheets

(56) References Cited

U.S. PATENT DOCUMENTS

| | | |
|---|---|---|
| 6,534,380 B1 | 3/2003 | Yamauchi et al. |
| 6,602,761 B2 | 8/2003 | Fukunaga |
| 6,686,623 B2 | 2/2004 | Yamazaki |
| 6,778,164 B2 | 8/2004 | Yamazaki et al. |
| 6,803,264 B2 | 10/2004 | Yamazaki et al. |
| 6,875,633 B2 | 4/2005 | Fukunaga |
| 6,927,148 B2 | 8/2005 | Ito |
| 7,064,049 B2 | 6/2006 | Ito et al. |
| 7,119,365 B2 | 10/2006 | Takafuji et al. |
| 7,148,124 B1 | 12/2006 | Usenko |
| 7,176,525 B2 | 2/2007 | Fukunaga |
| 7,199,024 B2 | 4/2007 | Yamazaki |
| 7,256,776 B2 | 8/2007 | Yamazaki et al. |
| 7,410,882 B2 | 8/2008 | Wong et al. |
| 7,473,971 B2 | 1/2009 | Yamazaki et al. |
| 7,476,576 B2 | 1/2009 | Yamazaki et al. |
| 7,535,053 B2 | 5/2009 | Yamazaki |
| 7,579,654 B2 | 8/2009 | Couillard et al. |
| 7,619,250 B2 | 11/2009 | Takafuji et al. |
| 7,745,268 B2 | 6/2010 | Miyairi |
| 7,820,524 B2 | 10/2010 | Miyairi et al. |
| 7,867,873 B2 | 1/2011 | Murakami et al. |
| 7,897,476 B2 | 3/2011 | Yamazaki et al. |
| 7,978,190 B2 | 7/2011 | Yamazaki et al. |
| 2005/0042798 A1 | 2/2005 | Nagao et al. |
| 2007/0108510 A1 | 5/2007 | Fukunaga |
| 2007/0141803 A1 | 6/2007 | Boussagol et al. |
| 2007/0173000 A1 | 7/2007 | Yamazaki |
| 2007/0238312 A1 | 10/2007 | Murakami et al. |
| 2007/0281440 A1 | 12/2007 | Cites et al. |
| 2009/0029525 A1 | 1/2009 | Ohnuma |
| 2009/0111248 A1 | 4/2009 | Ohnuma et al. |
| 2009/0137101 A1 | 5/2009 | Yamazaki et al. |
| 2010/0087047 A1 | 4/2010 | Shimomura et al. |
| 2010/0093152 A1* | 4/2010 | Kerdiles et al. ............ 438/455 |
| 2010/0173472 A1 | 7/2010 | Nagano |
| 2011/0136320 A1 | 6/2011 | Yamazaki et al. |
| 2013/0089968 A1* | 4/2013 | Usenko ..................... 438/458 |

* cited by examiner

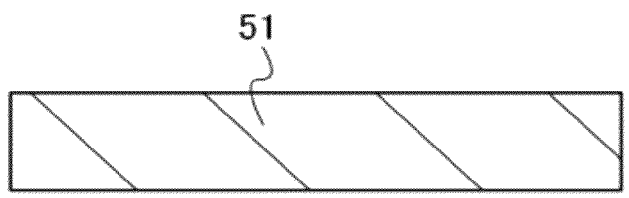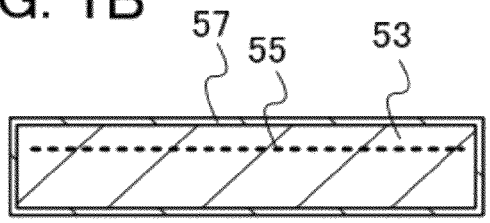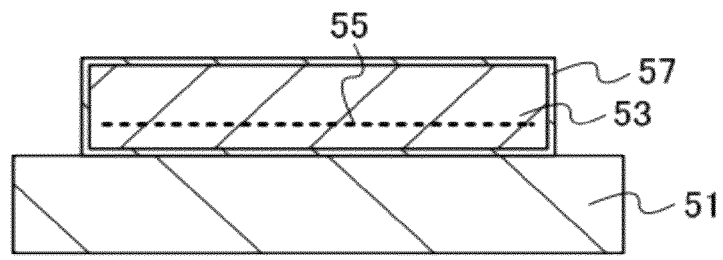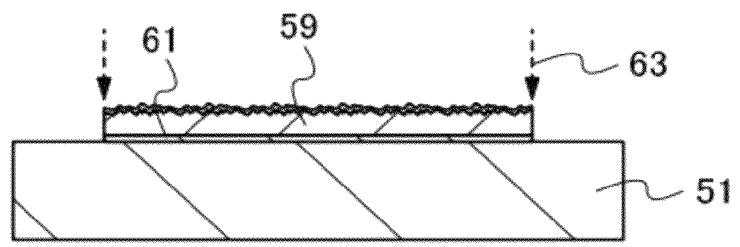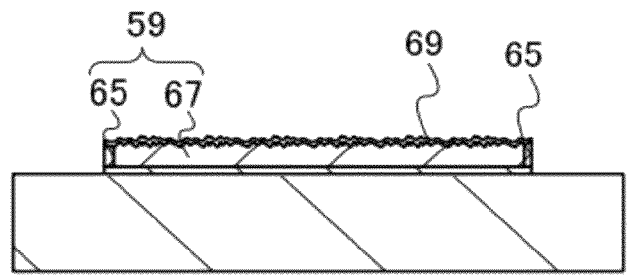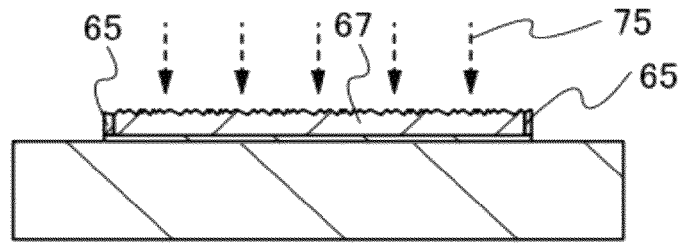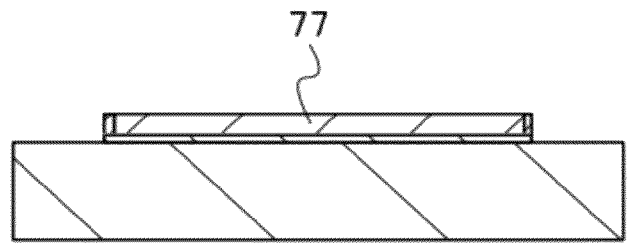

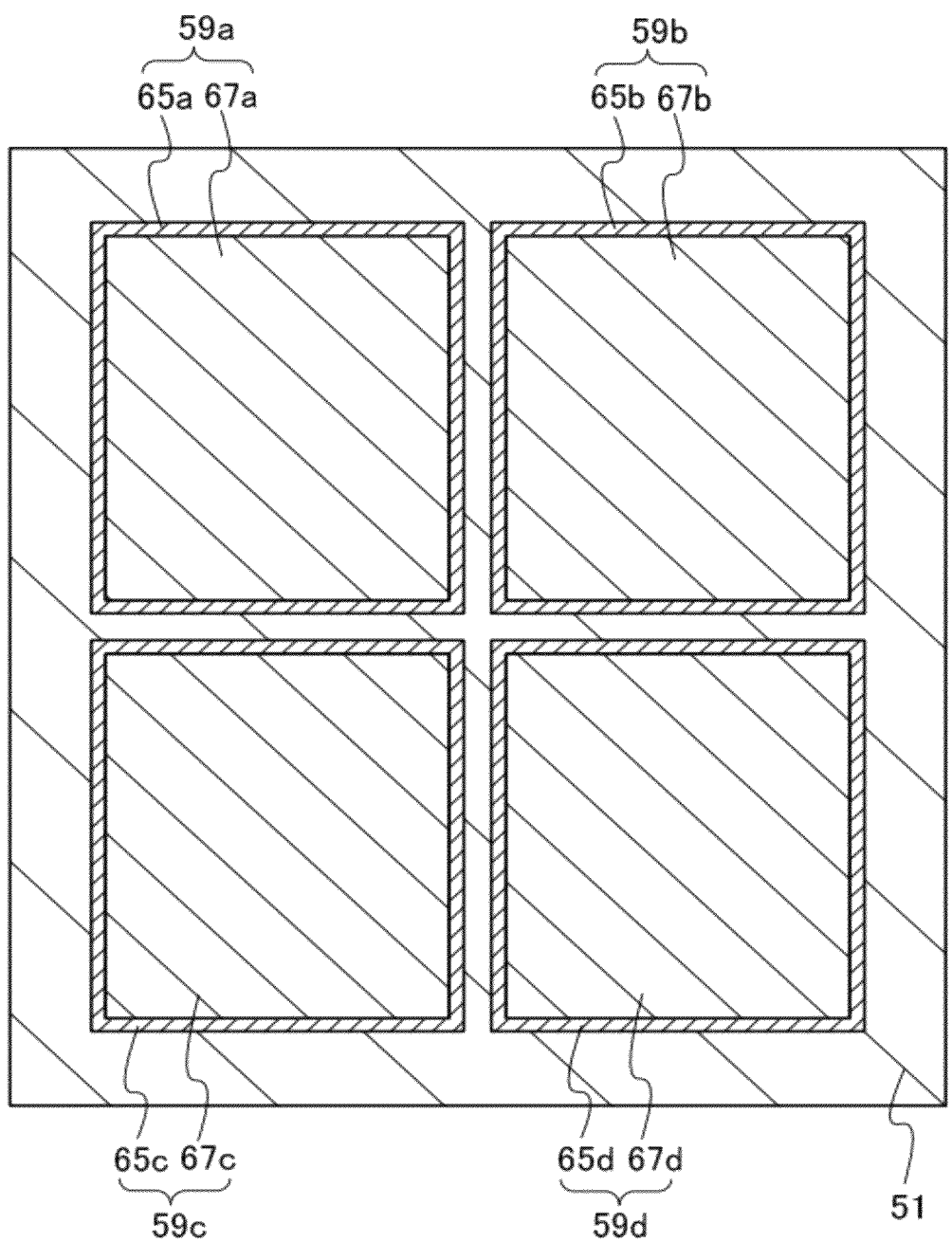

METHOD FOR MANUFACTURING SEMICONDUCTOR SUBSTRATE

BACKGROUND OF THE INVENTION

1. Field of the Invention

The present invention relates to a semiconductor substrate, a method for manufacturing the semiconductor substrate, and a method for manufacturing a semiconductor device using the semiconductor substrate.

2. Description of the Related Art

In recent years, as a semiconductor substrate, a silicon on insulator (SOI) substrate in which an insulating layer and a single crystal silicon layer are provided over a supporting substrate (also referred to as a base substrate) has been widely used.

As typical methods for manufacturing an SOI substrate, Smart Cut (registered trademark), epitaxial layer transfer (ELTRAN) (registered trademark), and the like are given.

A typical method for manufacturing an SOI substrate using a glass substrate as a supporting substrate is described below. First, by implanting a hydrogen ion to a single crystal silicon substrate, an embrittled region (also referred to as a damaged region) is formed at a predetermined depth from a surface of the single crystal silicon substrate. Then, the single crystal silicon substrate and the supporting substrate are bonded to each other with an insulating layer interposed therebetween. After that, a heat treatment is performed and the single crystal silicon substrate is cleaved (separated) at the embrittled region, so that the insulating layer and a thin single crystal silicon layer can be formed over the supporting substrate. That is, an SOI substrate is manufactured by transferring the single crystal silicon layer formed of a part of the single crystal silicon substrate to the supporting substrate.

A single crystal silicon layer which is transferred to a supporting substrate by the above-described method for manufacturing an SOI substrate has an uneven surface. Thus, a step for planarizing the surface of the single crystal silicon layer is needed. As a typical example of a method for planarizing the single crystal silicon layer, a method in which a surface of a single crystal silicon layer is irradiated with laser light to melt a depressed portion and a projected portion of the single crystal silicon layer and solidification is performed, so that the single crystal silicon layer is planarized can be given (see Patent Document 1).

REFERENCE

Patent Document

[Patent Document 1] Japanese Published Patent Application No. 2008-288563

SUMMARY OF THE INVENTION

However, at the time of irradiation with laser light for planarization of a surface of a single crystal silicon layer transferred to a supporting substrate, in the case where an oxide insulating layer such as a native oxide layer exists over the surface of the single crystal silicon layer, oxygen contained in the oxide insulating layer is mixed into a melted part of the single crystal silicon layer. Accordingly, although the surface of the solidified single crystal silicon layer is planarized, the single crystal silicon layer includes defects.

On the other hand, when the oxide insulating layer over the surface of the single crystal silicon layer transferred to the supporting substrate is removed before laser light irradiation for planarization, at the time of removal of the oxide insulating layer, the supporting substrate is isotropically etched, and a void is formed below an edge portion of an oxide insulating layer over the supporting substrate, which makes peeling of an edge portion of the single crystal silicon layer transferred to the supporting substrate likely to occur.

Peeling of the edge portion of the single crystal silicon layer results in generation of a particle, causing a reduction in yield of a semiconductor substrate.

Thus, an object of one embodiment of the present invention is to reduce defects in a semiconductor substrate. Another object of one embodiment of the present invention is to manufacture a semiconductor substrate with fewer defects with high yield. Another object of one embodiment of the present invention is to manufacture a semiconductor device with high yield.

One embodiment of the present invention is a method for manufacturing a semiconductor substrate (an SOI substrate). In the method, a semiconductor layer is formed over a supporting substrate with an oxide insulating layer interposed therebetween, adhesiveness between the supporting substrate and the oxide insulating layer in an edge portion of the semiconductor layer is increased, an insulating layer over a surface of the semiconductor layer is then removed, and the semiconductor layer is irradiated with laser light, so that a planarized semiconductor layer is obtained.

As a method for increasing the adhesiveness between the supporting substrate and the oxide insulating layer in the edge portion of the semiconductor layer, there is a method in which laser light irradiation is performed from the surface of the semiconductor layer. At this time, the edge portion of the semiconductor layer is irradiated with the laser light having energy allowing an increase in the adhesiveness between the supporting substrate and the oxide insulating layer. Note that it is preferable that the laser light have energy with which the irradiated semiconductor layer is completely melted. As a result, the energy of the laser light is transferred to the oxide insulating layer, so that the adhesiveness between the supporting substrate and the oxide insulating layer is increased. Therefore, in the step of removing the insulating layer over the surface of the semiconductor layer, lifting and peeling of the edge portion of the semiconductor layer can be prevented. Note that a part of the semiconductor layer which is completely melted by laser light irradiation is recrystallized so as to be a polycrystalline semiconductor region.

As another method for increasing the adhesiveness between the supporting substrate and the oxide insulating layer in the edge portion of the semiconductor layer, there is a method in which the edge portion of the semiconductor layer is heated. At this time, the edge portion of the semiconductor layer is heated at a temperature which allows an increase in the adhesiveness between the supporting substrate and the oxide insulating layer. Note that it is preferable that the heating temperature be lower than the strain point of the supporting substrate. As a result of the heating, the adhesiveness between the supporting substrate and the oxide insulating layer is increased. Therefore, in the step of removing the insulating layer over the surface of the semiconductor layer, lifting and peeling of the edge portion of the semiconductor layer can be prevented.

Further, one embodiment of the present invention is a method for manufacturing a semiconductor device. The method is as follows: a semiconductor layer is formed over a supporting substrate with an oxide insulating layer interposed therebetween; adhesiveness between the supporting substrate and the oxide insulating layer in an edge portion of the semiconductor layer is increased; an insulating layer over a surface of the semiconductor layer is then removed; the semiconductor layer is irradiated with laser light, so that a planarized semiconductor layer is obtained; and a semiconductor element is manufactured using the semiconductor layer.

Note that in this specification, the term "single crystal" means a crystal which has a periodic structure and crystal axes oriented in the same direction in any part of the crystal. However, disorder of regularity such as a defect and lattice distortion may be included in a single crystal.

Further, in this specification, a semiconductor substrate means a substrate (e.g., an SOI substrate) in which a semiconductor layer is formed over a supporting substrate with an insulating layer interposed therebetween.

According to one embodiment of the present invention, a semiconductor substrate with fewer defects and a planarized surface can be obtained. Further, according to one embodiment of the present invention, a semiconductor substrate with fewer defects and a planarized surface can be manufactured with high yield. Furthermore, according to one embodiment of the present invention, productivity of a semiconductor device can be increased.

BRIEF DESCRIPTION OF THE DRAWINGS

In the accompanying drawings:

FIGS. 1A to 1G are cross-sectional views illustrating a method for manufacturing a semiconductor substrate according to one embodiment of the present invention;

FIG. 7 is a top view illustrating a method for manufacturing a semiconductor substrate according to one embodiment of the present invention;

DETAILED DESCRIPTION OF THE INVENTION

Figure 2A:
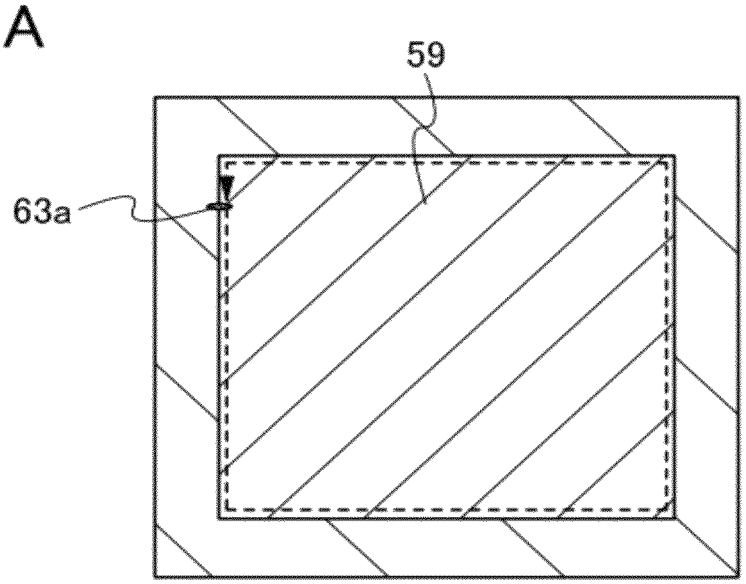
FIGS. 2A and 2B are top views illustrating a method for manufacturing a semiconductor substrate according to one embodiment of the present invention.

Hereinafter, embodiments of the present invention are described below with reference to the drawings. Note that the present invention is not limited to the following description and it will be readily appreciated by those skilled in the art that modes and details can be modified in various ways without departing from the spirit and the scope of the present invention. Accordingly, the present invention should not be construed as being limited to the description of the embodiments to be given below. Note that in a structure of the present invention to be described below, the same reference numerals are used to denote the same components in different drawings.

Embodiment 1

In this embodiment, a mode of a structure of a semiconductor substrate and a mode of a method for manufacturing the semiconductor substrate will be described.

A method for manufacturing a semiconductor substrate is described with reference to FIGS. 1A to 1G.

First, a supporting substrate 51 (also referred to as a base substrate) is prepared (see FIG. 1A).

As the supporting substrate 51, an insulating substrate such as a glass substrate, a ceramic substrate, a quartz substrate, or a sapphire substrate is used. Note that an insulating substrate such as a plastic substrate, a semiconductor substrate such as a silicon substrate, or a conductive substrate such as a metal substrate or a stainless steel substrate may be used as the supporting substrate 51 as appropriate.

In the case of employing a glass substrate, a glass substrate whose strain point is higher than or equal to 580° C. and lower than or equal to 730° C. is preferable. Further, it is preferable that the glass substrate be a non-alkali glass substrate. As a material of the non-alkali glass substrate, a glass material such as aluminosilicate glass, aluminoborosilicate glass, or barium borosilicate glass is used, for example. When an inexpensive glass or plastic substrate is used, cost can be reduced.

An insulating layer may be formed over a surface of the supporting substrate 51. By providing the insulating layer, in the case where impurities (such as an alkali metal or an alkaline earth metal) are contained in the supporting substrate 51, the impurities can be prevented from being diffused into a semiconductor layer which is to be transferred to the supporting substrate 51 in a later step. As the insulating layer, a silicon oxide layer, a silicon nitride layer, a silicon oxynitride layer, a silicon nitride oxide layer, or the like which is formed by a sputtering method or a CVD method can be given.

Note that silicon oxynitride contains more oxygen than nitrogen and silicon nitride oxide contains more nitrogen than oxygen. Here, the contents are compared based on results of measurement by Rutherford backscattering spectrometry or hydrogen forward scattering spectrometry.

Then, a semiconductor substrate 53 having an embrittled region 55 (also referred to as a damaged region) is prepared (see FIG. 1B). Note that it is preferable that at least one surface of the semiconductor substrate 53 be provided with an oxide insulating layer 57. A method for manufacturing the semiconductor substrate 53 having the embrittled region 55 is described below.

As the semiconductor substrate 53, a polycrystalline substrate or a single crystal substrate formed using a semiconductor material such as silicon, silicon germanium, silicon carbide, gallium arsenide, or indium phosphide is given. Here, a single crystal silicon substrate is used as the semiconductor substrate 53.

As the semiconductor substrate 53, a circular semiconductor substrate, a rectangular semiconductor substrate obtained by processing a circular semiconductor substrate, or the like can be used as appropriate. Here, a rectangular semiconductor substrate is used as the semiconductor substrate 53.

After that, the embrittled region 55 (also referred to as the damaged region) is formed in the semiconductor substrate 53.

The semiconductor substrate 53 is irradiated with ions (an ion beam) accelerated by an electric field and the ions are introduced at a predetermined depth from a surface of the semiconductor substrate 53, so that microvoids are formed. A region where the microvoids are formed is the embrittled region 55. Depending on the depth at which the embrittlement region 55 is formed, the thickness of the semiconductor layer which is separated from the semiconductor substrate 53 is determined. The depth at which the embrittled region 55 is formed is greater than or equal to 50 nm and less than or equal to 1 µm, preferably greater than or equal to 50 nm and less than or equal to 300 nm from the surface of the semiconductor substrate 53.

Further, introduction of the ions can be performed with the use of hydrogen, an inert element, or halogen by an ion doping method or an ion implantation method. As an inert element, helium is used for example, and as halogen, fluorine is used for example.

Then, the oxide insulating layer 57 is formed over at least one surface of the semiconductor substrate 53. The oxide insulating layer 57 functions as a bonding layer for bonding the two substrates. As the oxide insulating layer 57, a silicon oxide layer, a silicon oxynitride layer, or the like can be formed by a thin film deposition method such as a sputtering method or a CVD method. Alternatively, as the oxide insulating layer 57, a silicon oxide layer can be formed with the use of organosilane such as tetraethoxysilane. Further alternatively, an oxide insulating layer can be formed over the entire surface of the semiconductor substrate 53 by thermally oxidizing the semiconductor substrate 53. Note that in the case where the oxide insulating layer 57 is formed by thermal oxidation, an oxide insulating layer containing chlorine can be formed by performing heating in an atmosphere containing oxygen and hydrogen chloride.

Here, the surface of the semiconductor substrate 53 is oxidized by thermal oxidation in an atmosphere containing oxygen and hydrogen chloride, so that a silicon oxide layer containing chlorine is formed as the oxide insulating layer 57.

Note that other than the above-described methods by which the semiconductor substrate 53 having the embrittled region 55 and the oxide insulating layer 57 is formed, there is also a method in which a porous region is formed by anodizing one surface of the semiconductor substrate, a semiconductor layer is epitaxially grown over the porous region, and then an oxide insulating layer is formed over the semiconductor layer.

Then, the semiconductor substrate 53 and the supporting substrate 51 are bonded to each other with the oxide insulating layer 57 interposed therebetween (see FIG. 1C).

Note that it is preferable that a surface to be bonded (also referred to as a bonding surface) of the supporting substrate 51 or the semiconductor substrate 53 be subjected to a surface treatment before performing bonding. By performing a surface treatment, hydrophilicity or cleanliness is improved, whereby bonding strength at the time of bonding can be improved. Note that the surface treatment may be performed at least one of the surfaces to be bonded of the supporting substrate 51 and the semiconductor substrate 53.

Note that, as a surface treatment, a wet treatment (e.g., ozone water cleaning, megasonic cleaning, and two-fluid cleaning) and a dry treatment (e.g., an ultraviolet treatment, an ozone treatment, a plasma treatment, and a radical treatment) can be given. Further, such treatments may be performed in combination.

Furthermore, just before bonding of the supporting substrate 51 and the semiconductor substrate 53, the supporting substrate 51 or the semiconductor substrate 53 may be heated at a temperature that allows water to evaporate, typically higher than or equal to 55° C. and lower than or equal to 100° C. so that moisture on the surface of the supporting substrate 51 or the oxide insulating layer 57 is removed. As a result, entry of a gas and a particle together with remaining moisture into an interface between the supporting substrate 51 and the oxide insulating layer 57 can be prevented; thus, defective bonding can be prevented.

Then, in the two bonded substrates, the semiconductor substrate 53 is cleaved (separated) at the embrittled region 55. As a result, a semiconductor layer 59 which is formed of a part of the semiconductor substrate 53 can be provided on the supporting substrate 51. Note that as a result of this cleavage, in the case where the oxide insulating layer 57 is formed over the entire surface of the semiconductor substrate, the oxide insulating layer 57 is also cleaved. The cleaved oxide insulating layer 57 is referred to as an oxide insulating layer 61 (see FIG. 1D).

Here, the semiconductor substrate 53 is cleaved at the embrittled region 55 by a heat treatment. The heat treatment may be performed at a temperature higher than or equal to 500° C. and lower than the strain point of the supporting substrate 51. Through the heat treatment, pressure inside the microvoids in the embrittled region 55 is increased. By an increase in the pressure, the microvoids in the embrittled region 55 are changed in volume and the semiconductor substrate 53 is cleaved at the embrittled region 55. Note that in this embodiment, since the embrittled region 55 is not formed in an edge portion of the semiconductor substrate 53, the semiconductor substrate 53 is cleaved with the edge portion remaining on the semiconductor substrate 53 side, so that the edge portion is not transferred to the supporting substrate 51.

Note that the embrittled region 55 may be removed by water jetting in the case where the embrittled region 55 is formed by anodization of the semiconductor substrate.

Then, for an increase in the adhesiveness between the supporting substrate 51 and the oxide insulating layer 61, an edge portion of the semiconductor layer 59 is irradiated with laser light 63.

The laser light 63 preferably has energy with which the adhesiveness between the supporting substrate 51 and the oxide insulating layer 61 is increased. Such energy of laser light corresponds to energy with which the semiconductor layer 59 is completely melted. Here, complete melting means that the semiconductor layer 59 is melted to an interface with the oxide insulating layer 61 to be in a liquid state. When the semiconductor layer 59 is completely melted, the energy of the laser light is transferred to the oxide insulating layer 61, so that the adhesiveness between the supporting substrate 51 and the oxide insulating layer 61 is increased with the energy.

The wavelength of the laser light 63 is preferably a wavelength at which the laser light 63 is absorbed by the semiconductor layer 59, and typically, the laser light 63 is preferably ultraviolet to near-infrared light, a wavelength of which ranges from 190 nm to 2000 nm.

Further, when a continuous-wave laser is used, the laser light on an irradiated surface is in a point-like shape or an elliptical shape. When a pulsed laser is used, the laser light on an irradiated surface is in a linear shape or a rectangular shape. The repetition rate of the pulsed laser is preferably about greater than or equal to 1 Hz and less than or equal to 10 MHz.

As a method for irradiation with the laser light 63, there is a method in which scanning with laser light 63a which is in a point-like or elliptical shape on the irradiated surface is performed along the edge portion of the semiconductor layer 59 as expressed by an arrow in FIG. 2A. By such a method in which scanning with the laser light 63*a* is performed, the edge portion of the semiconductor layer 59 can be selectively irradiated with the laser light 63*a* without rotating the supporting substrate 51.

Figure 2B:
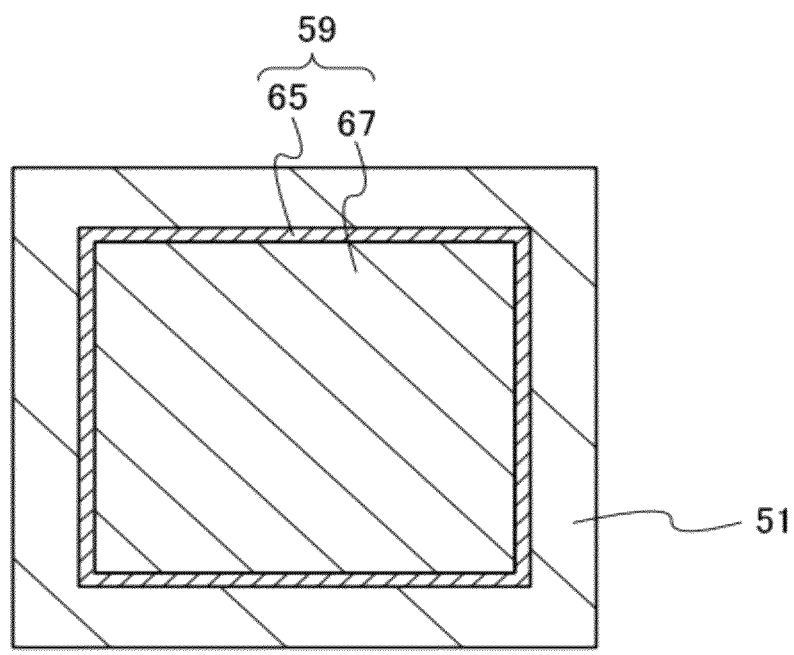

As a result, as illustrated in FIG. 2B, a polycrystalline semiconductor region 65 is formed in the edge portion of the semiconductor layer 59, and the adhesiveness between the supporting substrate 51 and the oxide insulating layer (not shown) can be increased in the edge portion of the semiconductor layer 59. Note that in the semiconductor layer 59, a region which is not irradiated with the laser light 63*a* is a semiconductor layer 67.

Figure 3A:
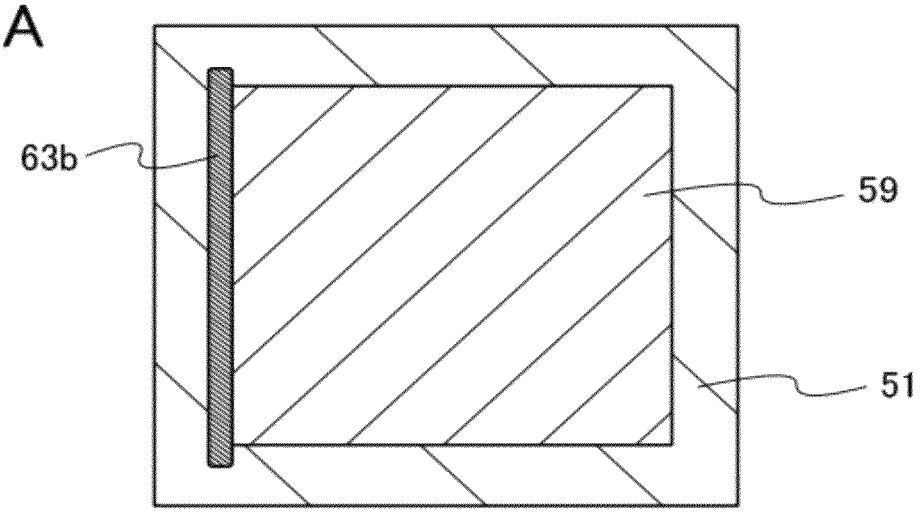
FIGS. 3A to 3C are top views illustrating a method for manufacturing a semiconductor substrate according to one embodiment of the present invention.
Figure 3B:
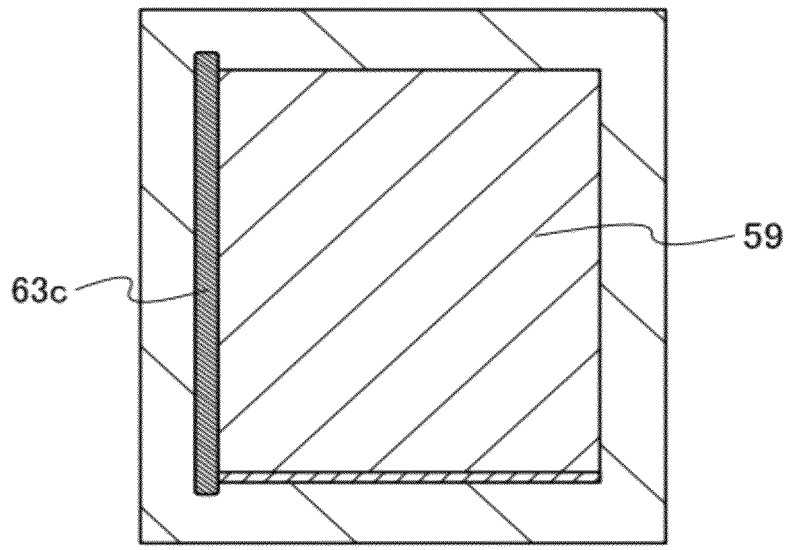
Figure 3C:
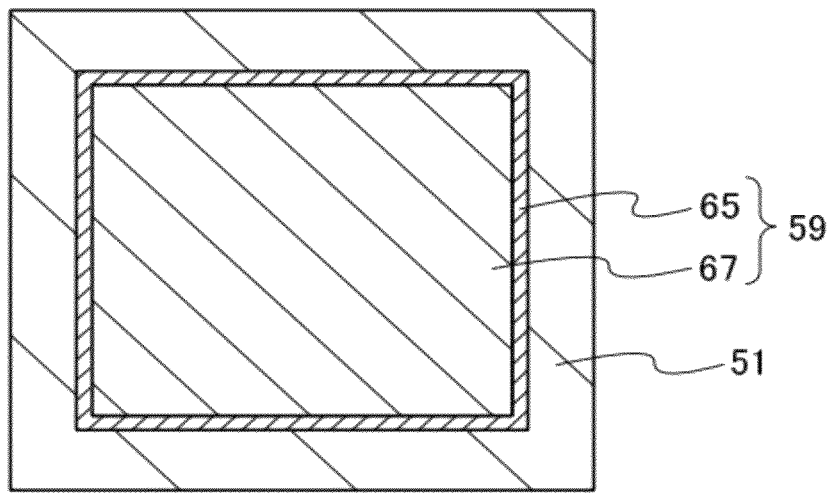

Further, as a method for irradiation with laser light which is different from that illustrated in FIGS. 2A and 2B, there is a method in which irradiation with laser light 63*b* which is in a linear or rectangular shape on an irradiated surface is performed on each side of the semiconductor layer 59. By such a method in which irradiation with the laser light 63*b* is performed, time for irradiating the edge portion of the semiconductor layer 59 with the laser light 63*b* can be shortened. For example, as illustrated in FIG. 3A, a first side of the semiconductor layer 59 is irradiated with the laser light 63*b* and then the supporting substrate 51 is rotated 90°. Subsequently, as illustrated in FIG. 3B, a second side of the semiconductor layer 59 is irradiated with laser light 63*c*. A step of laser light irradiation and a step of rotating the substrate which are described above are repeated in accordance with the number of the sides of the semiconductor layer, whereby the polycrystalline semiconductor region 65 is formed in the edge portion of the semiconductor layer 59 as illustrated in FIG. 3C and adhesiveness between the supporting substrate 51 and the oxide insulating layer (not shown) in the edge portion of the semiconductor layer 59 can be increased. Note that in the semiconductor layer 59, a region which is irradiated with neither the laser light 63*b* nor the laser light 63*c* is the semiconductor layer 67.

Here, a laser irradiation apparatus which performs irradiation with laser light which is in a circular or elliptical shape on an irradiated surface as illustrated in FIG. 2A is described with reference to FIG. 4.

Figure 4:
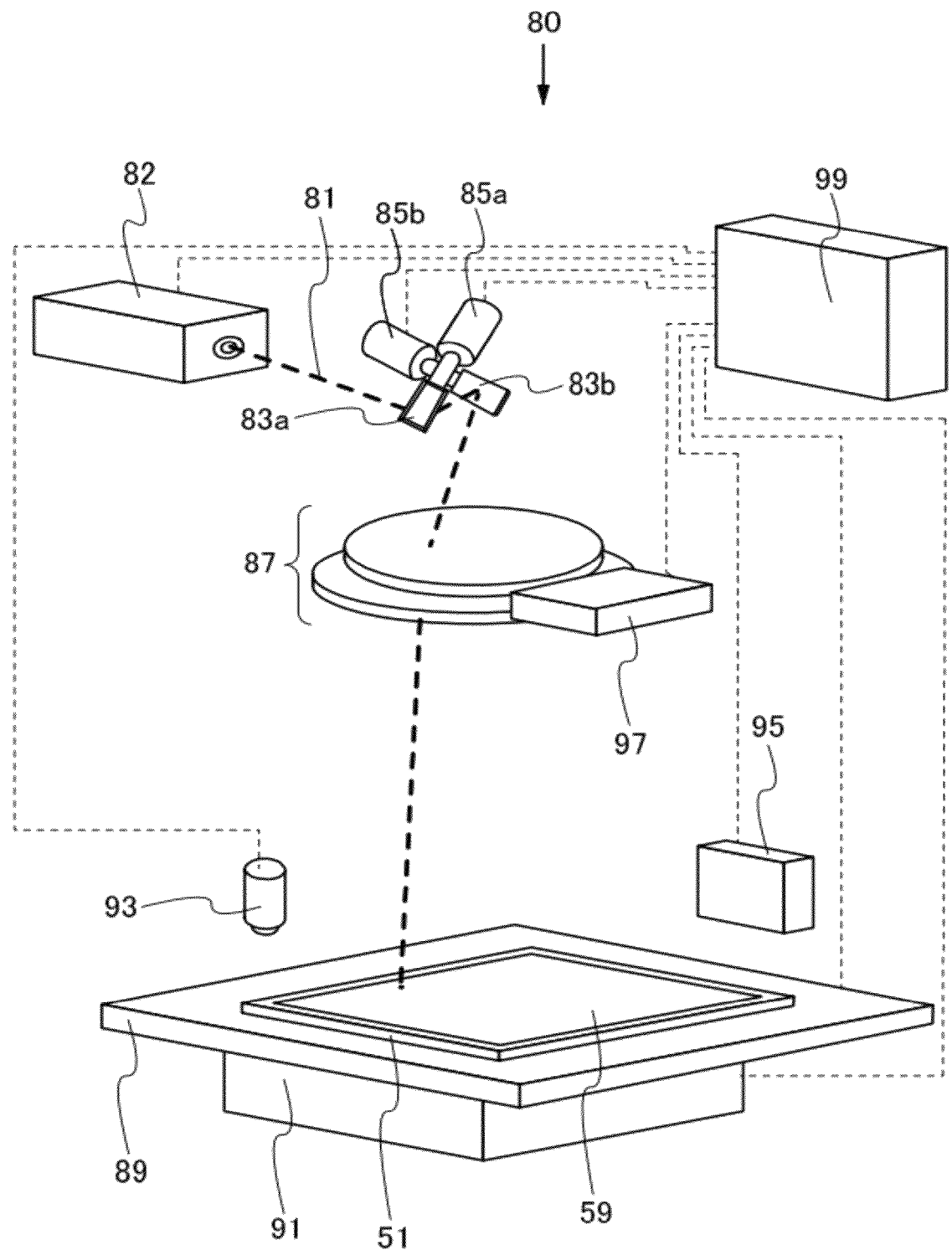
FIG. 4 is a perspective view illustrating a laser irradiation apparatus.

FIG. 4 is a perspective view illustrating a laser irradiation apparatus 80.

The laser irradiation apparatus 80 includes a laser oscillator 82 emitting laser light 81, galvanometer mirrors 83*a* and 83*b* each reflecting the laser light 81 at a given angle, a galvanometer scanner 85*a* driving the galvanometer mirror 83*a*, a galvanometer scanner 85*b* driving the galvanometer mirror 83*b*, an fθ lens 87 condensing the laser light 81 reflected by the galvanometer mirrors 83*a* and 83*b* on an irradiated surface, an XY stage 89 controlling the position of the supporting substrate 51, and a Z axis table 91 adjusting the distance between the supporting substrate 51 and the fθ lens 87. In addition, the laser irradiation apparatus 80 further includes a charge coupled device (CCD) camera 93 detecting an irradiation position of the laser light 81, and a position detecting device 95 detecting the distance between the supporting substrate 51 and the fθ lens 87.

Further, each of the laser oscillator 82, the galvanometer scanners 85*a* and 85*b*, the XY stage 89, the Z axis table 91, the CCD camera 93, and the position detecting device 95 is connected to the control device 99. The control device 99 controls driving of the galvanometer scanners 85*a* and 85*b*. In accordance with information imaged by the CCD camera 93, the control device 99 controls driving of the galvanometer scanners 85*a* and 85*b* and movement of the XY stage 89, whereby an irradiation position of the laser light 81 in the semiconductor layer 59 is controlled. Further, in accordance with information obtained by the position detecting device 95, the control device 99 controls the fθ lens 87 or the Z axis table 91, whereby the distance between the fθ lens 87 and the Z axis table 91 is controlled.

Moreover, a shutter can be provided between the laser oscillator 82 and the galvanometer mirrors 83*a* and 83*b*. A mirror for changing an optical path of the laser light emitted by the laser oscillator 82 can be provided as appropriate. Furthermore, an autofocus mechanism 97 capable of adjusting the position or the fθ lens 87 in a Z axis direction may be provided.

By controlling inclination of the galvanometer mirrors 83*a* and 83*b*, a given part of an irradiated surface can be scanned with the laser light 81 emitted by the laser oscillator 82. Note that a polygon mirror, an acousto-optic deflector (AOD), or the like may be used instead of the galvanometer mirrors 83*a* and 83*b*.

The fθ lens 87 condenses the laser light 81, whereby the laser light 81 can be focused on an irradiated surface.

As the position detecting device 95, typically, an optical displacement sensor, an ultrasonic displacement sensor, a laser displacement sensor, or the like can be used as appropriate. Here, a laser displacement sensor is used as the position detecting device 95.

Note that although the laser irradiation apparatus in FIG. 4 includes one set of the laser oscillator 82, the galvanometer mirrors 83*a* and 83*b*, the galvanometer scanners 85*a* and 85*b*, and the fθ lens 87, productivity can be increased when the laser irradiation apparatus includes plural sets of the laser oscillator 82, the galvanometer mirrors 83*a* and 83*b*, the galvanometer scanners 85*a* and 85*b*, and the fθ lens 87.

A laser irradiation apparatus which is different from that in FIG. 4 is described with reference to FIG. 5.

Figure 5:
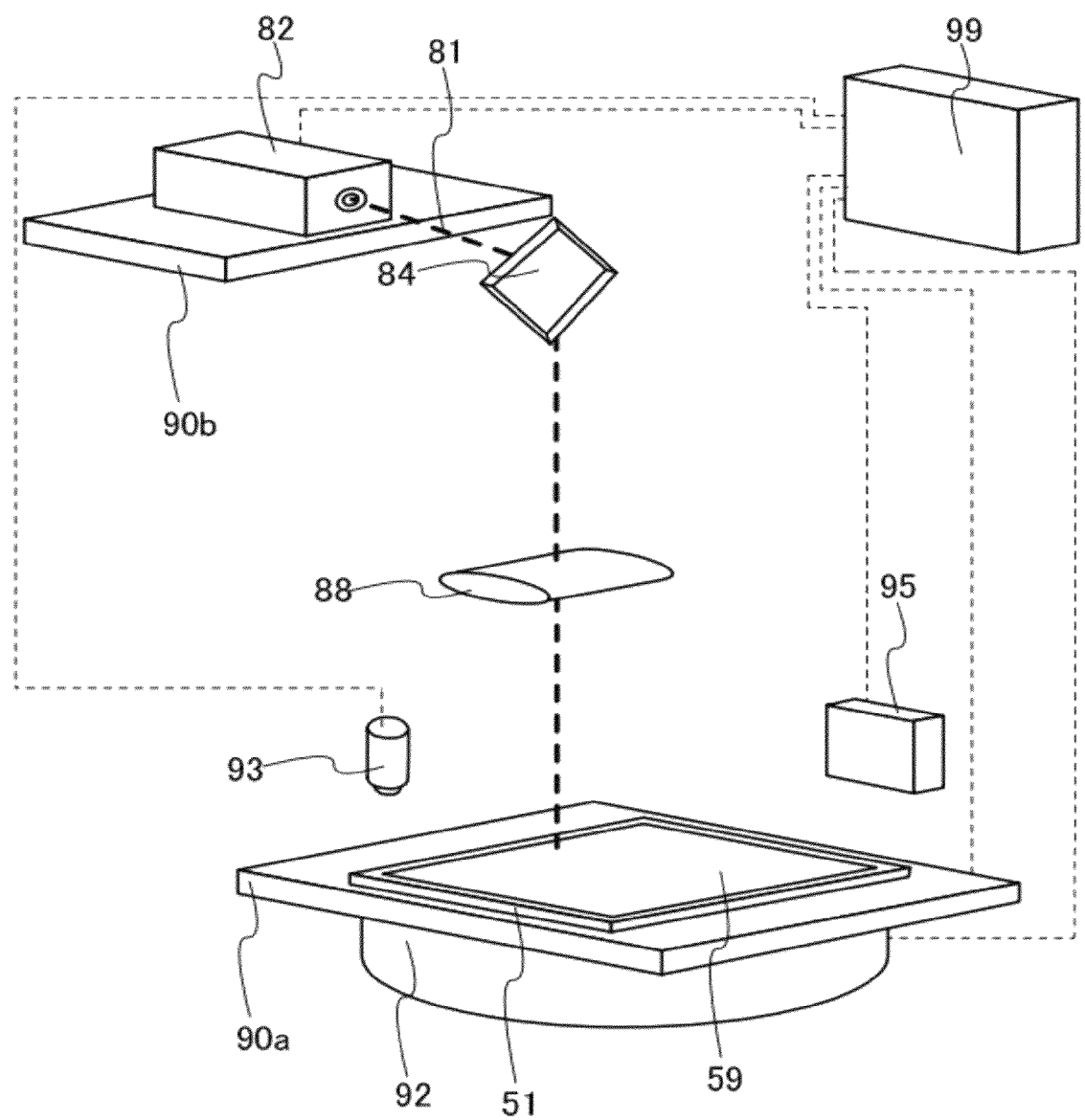
FIG. 5 is a perspective view illustrating a laser irradiation apparatus.

FIG. 5 is a perspective view illustrating a laser irradiation apparatus. The laser irradiation apparatus includes, between the laser oscillator 82 and the supporting substrate 51 with an irradiated surface, a mirror 84 controlling an optical path of laser light and a condenser lens 88 condensing the laser light on the irradiated surface. The laser irradiation apparatus further includes a θ stage 92 capable of rotating at a given angle and an X axis stage 90*a* provided over the θ stage 92. The laser irradiation apparatus further includes a Y axis stage 90*b* controlling movement of the laser oscillator 82, the mirror 84, and the condenser lens 88 in a Y axis direction. Note that in FIG. 5, the Y axis stage 90*b* is provided for the laser oscillator 82, the mirror 84, and the condenser lens 88. Note that the X axis stage or Y axis stage may be provided with an autofocus mechanism capable of position adjustment in the Z axis direction.

Note that although the Y axis stage 90*b* is provided for the laser oscillator 82, the mirror 84, and the condenser lens 88 here, the Y axis stage 90*b* may be provided for the X axis stage 90*a*.

Next, a method for laser light irradiation using the laser irradiation apparatus illustrated in FIG. 5 is described. An optical path of the laser light 81 that is emitted by the laser oscillator 82 is changed so as to head to the supporting substrate 51 side by the mirror 84. A first side of the semiconductor layer 59 is irradiated with the laser light condensed by the condenser lens 88 through movement of the X axis stage or the Y axis stage.

Subsequently, the θ stage 92 is rotated 90°, and the X axis stage or the Y axis stage is then moved, so that a second side perpendicular to the first side is irradiated with the laser light.

By alternately operating the X or Y axis stage and the θ stage 92, an entire edge portion of the semiconductor layer 59 can be irradiated with the laser light.

Note that although the laser irradiation apparatus in FIG. 5 includes one set of the laser oscillator 82, the mirror 84, and the condenser lens 88, productivity can be increased when the laser irradiation apparatus includes plural sets of the laser oscillator 82, the mirror 84, and the condenser lens 88.

Note that in this embodiment, a laser irradiation apparatus having a different structure can be used as appropriate instead of the laser irradiation apparatuses illustrated in FIG. 4 and FIG. 5.

The adhesiveness between the supporting substrate 51 and the oxide insulating layer 61 can be increased by irradiating the edge portion of the semiconductor layer 59 with the laser light 63 as illustrated in FIG. 1D. Accordingly, in a later step of removing a native oxide layer formed over a surface of the semiconductor layer 59, lifting and peeling of the edge portion of the semiconductor layer due to melting of the supporting substrate 51 can be prevented.

Further, a region of the edge portion of the semiconductor layer 59 which is irradiated with the laser light 63 is completely melted and recrystallized to be the polycrystalline semiconductor region 65. Note that the region which is not irradiated with the laser light 63 here is referred to as the semiconductor layer 67. Moreover, a native oxide layer 69 is formed over a surface of the semiconductor layer 67 (see FIG. 1E). The native oxide layer 69 is formed when the semiconductor layer 67 is in contact with oxygen in air to be partly oxidized.

After that, the native oxide layer 69 formed over the surface of the semiconductor layer 67 is removed. Here, the native oxide layer 69 is removed by a wet etching method using hydrofluoric acid as an etchant. Note that since the adhesiveness between the supporting substrate 51 and the oxide insulating layer 61 is increased by laser light irradiation, entry of the etchant at an interface between the supporting substrate 51 and the oxide insulating layer 61 is prevented. As a result, lifting and peeling of the edge portion of the semiconductor layer 59 can be prevented.

Then, the semiconductor layer 67, from which the native oxide layer 69 has been removed, is irradiated with laser light 75 (see FIG. 1F). A projected portion and a depressed portion of the semiconductor layer 67 are melted in this step and then solidification by cooling is performed. As a result, a semiconductor layer 77 with increased planarity can be formed (see FIG. 1G).

As the laser light 75, similarly to the case of the laser light 63, laser light with a wavelength at which the laser light is absorbed by the semiconductor layer 67 can be used.

Further, irradiation with the laser light 75 is performed with energy with which the semiconductor layer 67 is partially or completely melted. Note that it is preferable that the semiconductor layer 67 be partially melted by irradiation with the laser light 75. In this case, the term "partial melting" means that an upper part of the semiconductor layer 67 is melted and is in a liquid phase while a lower part thereof is not melted and is still in a solid phase. By partially melting the semiconductor layer, crystal growth proceeds from a non-melted solid phase part. Thus, the semiconductor layer 77 with fewer defects, whose surface has high planarity can be formed. Moreover, by partial melting of the semiconductor layer 67, an increase in the temperature of the supporting substrate 51 can be suppressed. Therefore, a substrate with low heat-resistance such as a glass substrate can be used as the supporting substrate 51.

Note that for a reduction in the thickness of the semiconductor layer 77, a surface of the semiconductor layer 77 may be subjected to a treatment for improving planarity such as an etching treatment (e.g., dry etching or wet etching) or a polishing treatment (e.g., chemical mechanical polishing (CMP)).

Further, the polycrystalline semiconductor region that is formed by irradiation with the laser light 63 may be selectively removed.

This embodiment can be combined with any of the other embodiments as appropriate.

Embodiment 2

Figure 6A:
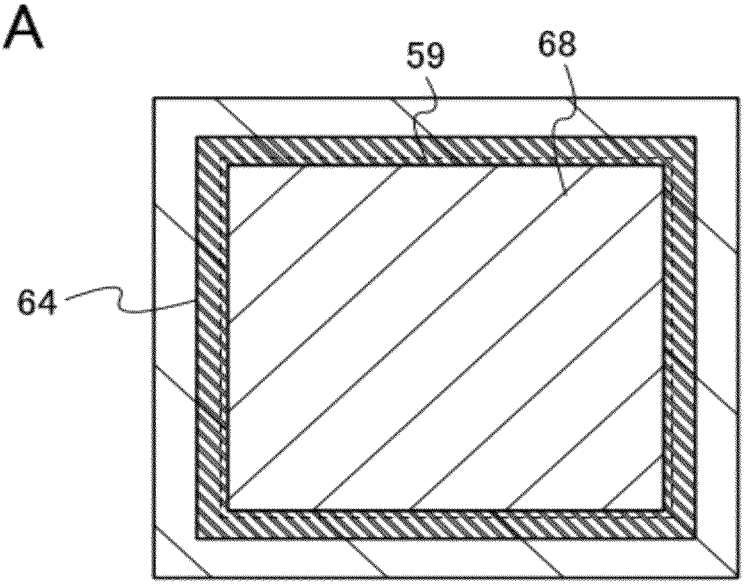
FIGS. 6A and 6B are top views illustrating a method for manufacturing a semiconductor substrate according to one embodiment of the present invention.

In this embodiment, a method for preventing lifting and peeling of an edge portion of a semiconductor layer transferred to a supporting substrate, which differs from the method in Embodiment 1, is described with reference to FIGS. 6A and 6B.

In this embodiment, an edge portion of a semiconductor layer transferred to a supporting substrate is heated by a heating means. Examples of a heating means are a heater having a linear shape; and a heater having a closed-loop shape similar to a shape of the edge portion of the semiconductor layer, typically a hollow square shape or a ring shape.

The heating means is pressed against the edge portion of the semiconductor layer. At this time, the heating means may be pressed against only the edge portion of the semiconductor layer or may be pressed against the edge portion of the semiconductor layer and the supporting substrate 51. A region 64 which is illustrated in FIG. 6A is a region where the heating means is pressed against at least the edge portion of the semiconductor layer 59 and the supporting substrate 51.

As a result, adhesiveness between the supporting substrate 51 and the oxide insulating layer (not shown) can be increased, so that lifting and peeling of the edge portion of the semiconductor layer 59 can be prevented.

Figure 6B:
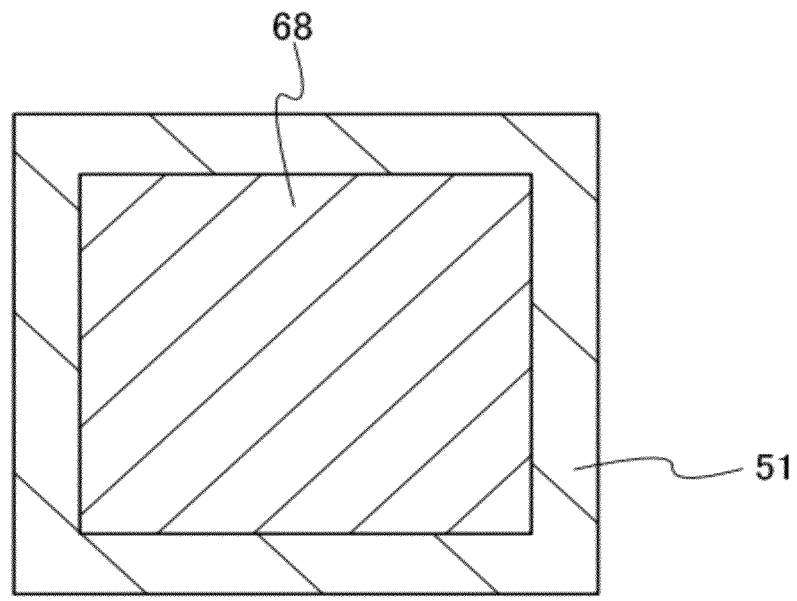

Note that after that, a region which is crystallized with the heating means may be removed, in which case only a semiconductor layer 68 against which the heating means is not pressed is provided over the supporting substrate 51 (see FIG. 6B).

Embodiment 3

In this embodiment, a mode of a structure of a semiconductor substrate and a mode of a method for manufacturing the semiconductor substrate which are different from those in Embodiment 1 will be described with reference to FIG. 7.

In a semiconductor substrate described in this embodiment, the supporting substrate 51 is provided with a plurality of semiconductor layers 59a, 59b, 59c, and 59d as illustrated in FIG. 7. A method for manufacturing the semiconductor substrate illustrated in FIG. 7 is described below.

A plurality of semiconductor substrates are bonded to the supporting substrate 51 with oxide insulating layers interposed therebetween. Here, in a manner similar to that in Embodiment 1, each of the plurality of semiconductor substrates is bonded to the supporting substrate 51. Then, the semiconductor substrates are cleaved at embrittled regions thereof, and the semiconductor layers 59a to 59d are transferred to the supporting substrate 51 with the oxide insulating layers (not shown) interposed therebetween. In addition, edge portions of the semiconductor layers 59a to 59d after cleavage are irradiated with laser light. As a result, polycrystalline semiconductor regions 65a, 65b, 65c, and 65d are formed in the edge portions of the semiconductor layers 59a to 59d, and adhesiveness between the supporting substrate 51 and the oxide insulating layers (not shown) can be increased, so that lifting and peeling of the edge portions of the semiconductor layers 59a to 59d can be prevented. Note that in the semiconductor layers 59a to 59d, regions which are not irradiated with the laser light are semiconductor layers 67a, 67b, 67c, and 67d.

Note that although the four semiconductor layers 59a to 59d are transferred to the supporting substrate 51 here, the number of semiconductor layers can be selected as appropriate.

After that, the steps described in Embodiment 1 with reference to FIGS. 1E to 1G are performed, whereby the semiconductor substrate can be manufactured.

Note that although the edge portions of the semiconductor layers transferred to the supporting substrate 51 are irradiated with the laser light here, the edge portions of the semiconductor layers may be heated by a heating means as described in Embodiment 2 so that the adhesiveness between the supporting substrate 51 and edge portions of the oxide insulating layers (not shown) is increased.

Through the above steps, regardless of the size of a semiconductor substrate to bond, a semiconductor substrate having a large area can be manufactured.

Embodiment 4

In this embodiment, one embodiment of a method for manufacturing a semiconductor device will be described with reference to FIGS. 8A to 8D and FIGS. 9A to 9D.

First, a semiconductor substrate manufactured according to any of Embodiments 1 to 3 is prepared as a semiconductor substrate 100. Here, a semiconductor substrate manufactured according to Embodiment 1 is used as the semiconductor substrate 100 (see FIG. 8A).

In the semiconductor substrate 100, a semiconductor layer 105 is provided over a supporting substrate 101 with an oxide insulating layer 103 interposed therebetween. The supporting substrate 101, the oxide insulating layer 103, and the semiconductor layer 105 can be formed in a manner similar to those of the supporting substrate 51, the oxide insulating layer 61, and the semiconductor layer 77, which are described in Embodiment 1, respectively.

Note that a surface of the semiconductor layer 105 may be subjected to a treatment for improving planarity such as an etching treatment (e.g., dry etching or wet etching) or a polishing treatment (e.g., CMP).

Further, an impurity element for controlling threshold voltage of a thin film transistor may be added to the semiconductor layer 105. As for the impurity element, for example, an acceptor imparting p-type conductivity such as boron may be added to a region in which a p-channel thin film transistor is formed, and a donor imparting n-type conductivity such as phosphorus may be added to a region in which an n-channel thin film transistor is formed.

Figure 8A:
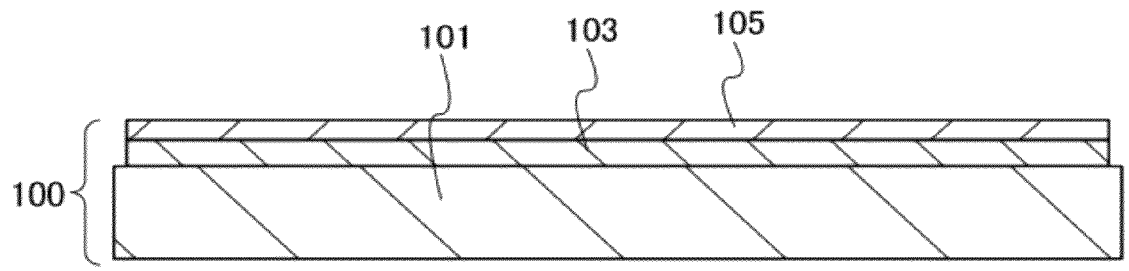
FIGS. 8A to 8D are cross-sectional views illustrating a method for manufacturing a semiconductor device according to one embodiment of the present invention.
Figure 8B:
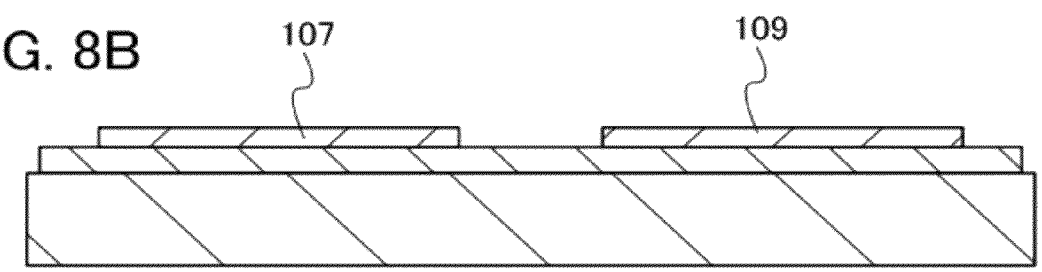
Figure 8C:
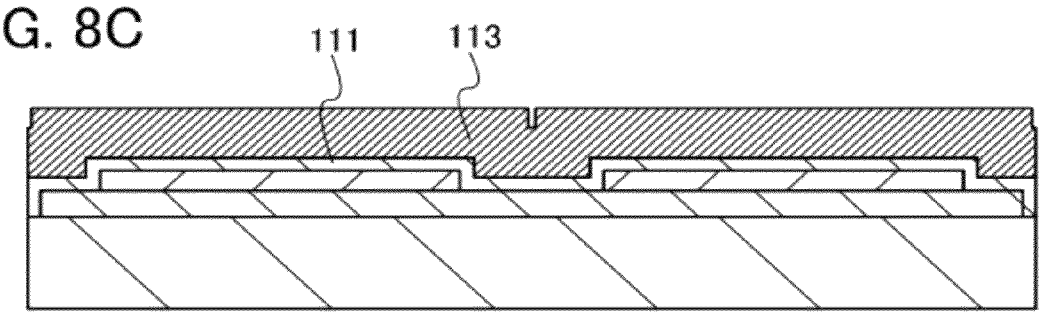
Figure 8D:
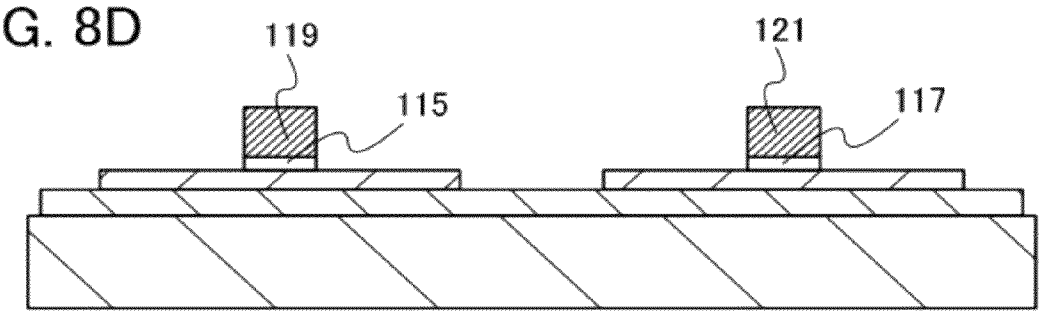

Then, the semiconductor layer 105 is selectively etched, so that semiconductor layers 107 and 109 are formed (see FIG. 8B). Note that the semiconductor layer 107 functions as a channel formation region of the n-channel thin film transistor and the semiconductor layer 109 functions as a channel formation region of the p-channel thin film transistor.

After that, an insulating layer 111 is formed over the semiconductor layers 107 and 109. Then, a conductive layer 113 is formed over the insulating layer 111 (see FIG. 8C).

The insulating layer 111 can have a single-layer structure or a stacked-layer structure using a silicon oxide layer, a silicon oxynitride layer, a silicon nitride layer, a silicon nitride oxide layer, and/or the like.

The conductive layer 113 can be formed with a single layer or a stack layer using a metal material such as molybdenum, titanium, tantalum, tungsten, aluminum, copper, neodymium, or scandium, or an alloy material which contains any of these materials as a main component.

Subsequently, a mask is formed over the conductive layer 113, and then the conductive layer 113 is etched with the use of the mask, so that gate electrodes 119 and 121 are formed. Further, the insulating layer 111 is etched with the use of the mask, so that gate insulating layers 115 and 117 are formed (see FIG. 8D). Note that it is also possible to use the insulating layer 111, which is not etched, as a gate insulating layer.

Then, the semiconductor layer 107 is covered with a mask 123. After that, an impurity element serving as an acceptor is added to the semiconductor layer 109, so that high-concentration impurity regions 125 and 127 are formed. The high-concentration impurity regions 125 and 127 serve as a source region and a drain region. Note that in the semiconductor layer 109, a region overlapping with the gate electrode 121 becomes a channel region 129 (see FIG. 9A). After that, the mask 123 is removed.

Here, boron is used as the impurity element serving as an acceptor, so that semiconductor regions to which boron is added are formed as the high-concentration impurity regions 125 and 127.

Then, the high-concentration impurity regions 125 and 127 and the channel region 129 are covered with a mask 131. After that, an impurity element serving as a donor is added to the semiconductor layer 107, so that high-concentration impurity regions 133 and 135 are formed. The high-concentration impurity regions 133 and 135 serve as a source region and a drain region. Note that in the semiconductor layer 107, a region overlapping with the gate electrode 119 becomes a channel region 137 (see FIG. 9B). After that, the mask 131 is removed.

Here, phosphorus is used as the impurity element serving as a donor, so that semiconductor regions to which phosphorus is added are formed as the high-concentration impurity regions 133 and 135.

Here, by adding the impurity elements to the semiconductor layers 107 and 109 with the use of the gate electrodes 119 and 121 as masks, the high-concentration impurity regions 125, 127, 133, and 135 can be formed in a self-aligned manner. Note that addition of the impurity elements may be performed by an ion doping method or an ion implantation method.

Note that the above-described order of steps may be reversed. That is, the high-concentration impurity regions 125 and 127 may be formed in the semiconductor layer 109 after the high-concentration impurity regions 133 and 135 are formed in the semiconductor layer 107.

Note that the following structure may be employed: low-concentration impurity regions are formed in the semiconductor layers 107 and 109 with the use of the gate electrodes 119 and 121 as masks, sidewalls are then formed on side surfaces of the gate electrodes 119 and 121, and high-concentration impurity regions are formed by adding impurity elements to the low-concentration impurity regions with the use of the gate electrodes 119 and 121 and the sidewalls as masks. In that case, the low-concentration impurity region is formed between the high-concentration impurity region and the channel region, whereby withstand voltage of the thin film transistor is increased and deterioration can be prevented.

Then, a heat treatment for activating the impurity element serving as a donor and the impurity element serving as an acceptor is performed.

Figure 9A:
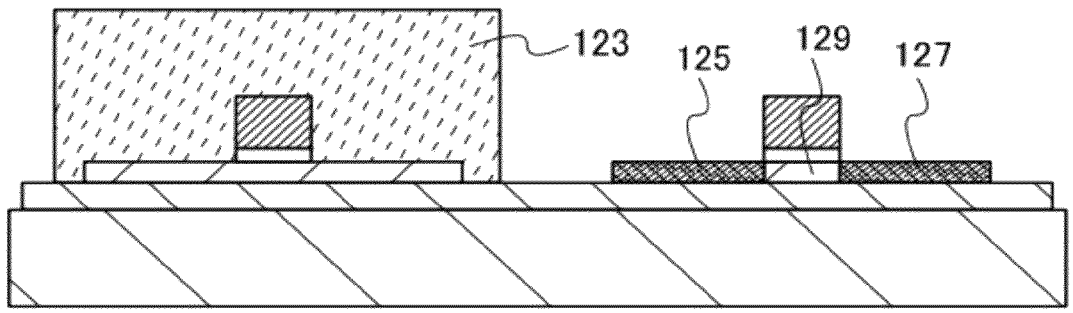
FIGS. 9A to 9D are cross-sectional views illustrating a method for manufacturing a semiconductor device according to one embodiment of the present invention.
Figure 9B:
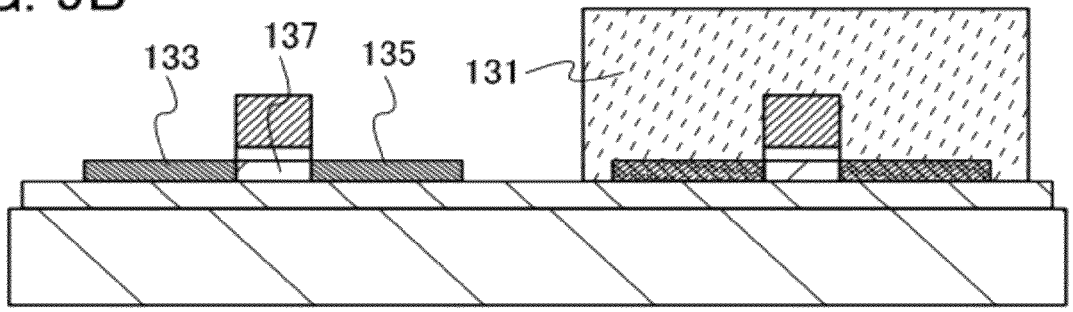
Figure 9C:
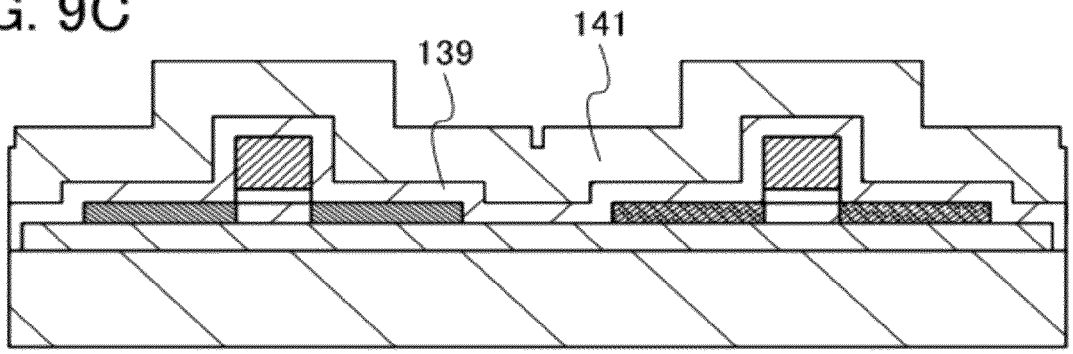

Subsequently, insulating layers 139 and 141 are formed and then a hydrogenation treatment by heating is performed (see FIG. 9C). Each of the insulating layers 139 and 141 can be formed by a CVD method to have a single-layer structure or a stacked-layer structure using a silicon oxide layer, a silicon nitride layer, a silicon oxynitride layer, and/or a silicon nitride oxide layer. When the insulating layer 139 is formed by a CVD method, a hydrogen content of the insulating layer 139 becomes higher, which makes it possible to hydrogenate the channel regions 129 and 137 and the high-concentration impurity regions 125, 127, 133, and 135 by a heat treatment, so that a dangling bond can be terminated by hydrogen and defects can be reduced.

Note that planarity of the insulating layer 141 can be high when the insulating layer 141 is formed using an inorganic material such as silicon oxide or boron phosphorus silicon glass (BPSG), or an organic material such as polyimide or acrylic.

After that, the insulating layers 139 and 141 are partly etched, so that contact holes are formed; then, wirings 143, 145, 147, and 149 which are in contact with the high-concentration impurity regions 125, 127, 133, and 135 are formed.

Each of the wirings 143, 145, 147, and 149 can be formed with a single layer or a stack layer using a metal material such as molybdenum, titanium, tantalum, tungsten, aluminum, copper, neodymium, or scandium, or an alloy material which contains any of these materials as a main component. The wirings 143, 145, 147, and 149 function as source electrodes and drain electrodes.

Figure 9D:
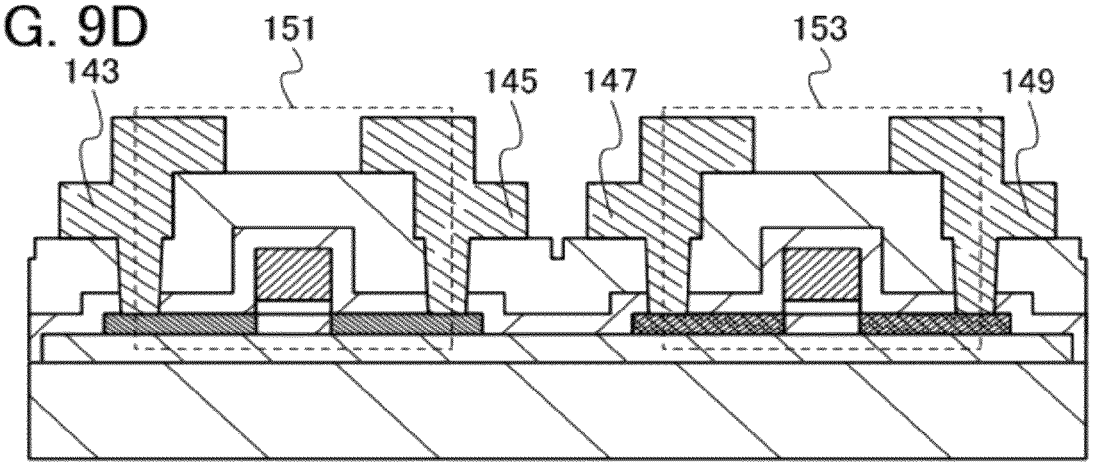

Through the above steps, a semiconductor device including an n-channel thin film transistor 151 and a p-channel thin film transistor 153 can be manufactured (see FIG. 9D). The n-channel thin film transistor 151 includes the high-concentration impurity regions 133 and 135 to which phosphorus is added. The p-channel thin film transistor 153 includes the high-concentration impurity regions 125 and 127 to which boron is added.

Although the method for manufacturing a thin film transistor is described in this embodiment, a variety of semiconductor elements such as a capacitor and a resistor can also be formed together with the thin film transistor.

This embodiment can be combined with any of the other embodiments as appropriate.

Embodiment 5

In this embodiment, a semiconductor device can be manufactured with the use of a transistor or a diode which uses the semiconductor substrate described in any of Embodiments 1 to 3. Typical examples of the semiconductor device are a liquid crystal display device, an organic light-emitting display device, an inorganic light-emitting display device, a memory device, a photoelectric conversion device, and the like. Here, a mode of a novel memory device which is capable of retaining data without supply of electric power and has no limitation on the number of writing is described.

Figure 10A:
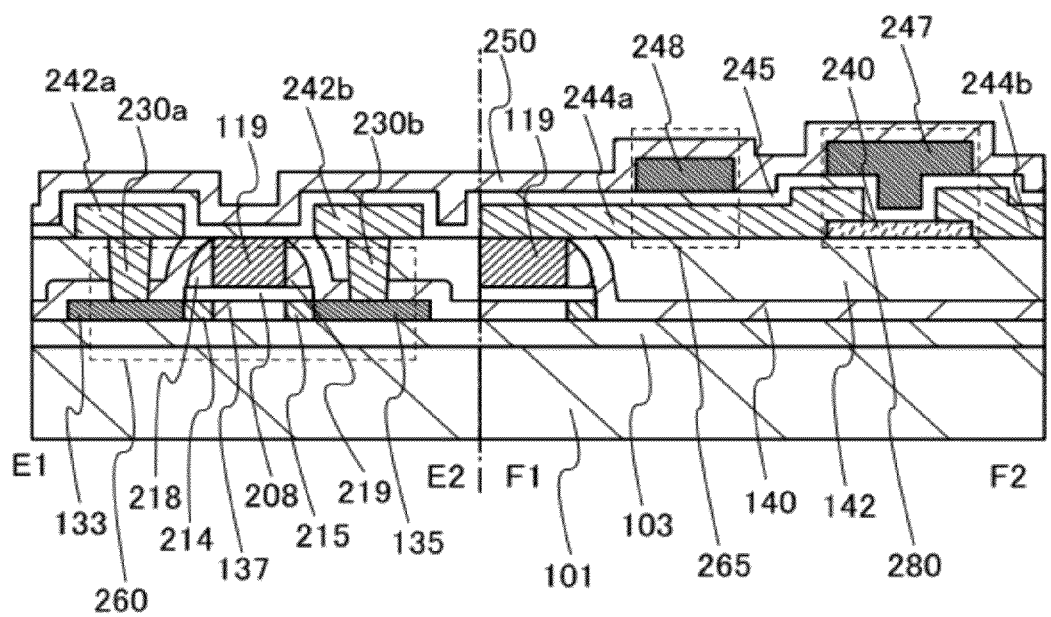
FIGS. 10A to 10C are a cross-sectional view, a top view, and a circuit diagram illustrating a semiconductor device according to one embodiment of the present invention.
Figure 10B:
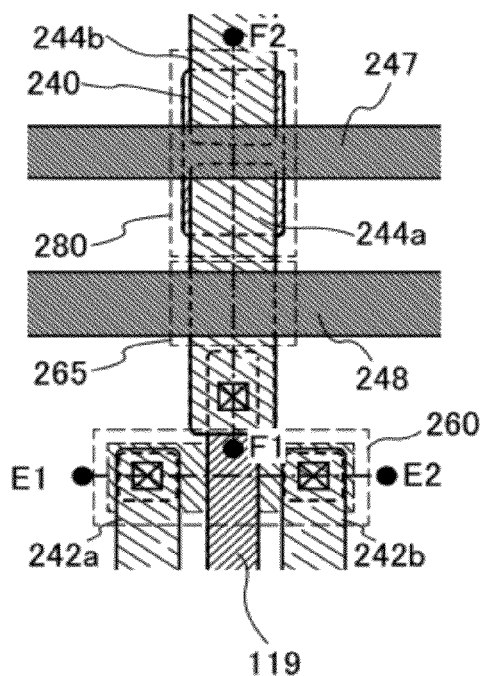
Figure 10C:
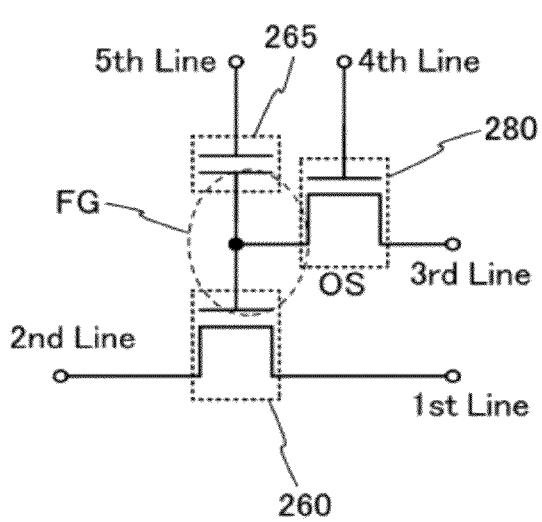

In FIGS. 10A to 10C, a mode of a structure of the memory device is illustrated. FIG. 10A is a cross-sectional view of the memory device, and FIG. 10B is a top view of the memory device. Here, FIG. 10A corresponds to a cross section along line E1-E2 and line F1-F2 in FIG. 10B. The memory device illustrated in FIGS. 10A and 10B includes a transistor 260 that uses the semiconductor substrate described in any of Embodiments 1 to 3 in a lower portion and a transistor 280 that uses an oxide semiconductor in an upper portion. The transistor 260 is similar to the thin film transistor 151 described in Embodiment 4; thus, for description of FIGS. 10A to 10C, the same reference numerals are used for the same parts as those in FIG. 1E.

The transistor 260 includes a semiconductor layer provided over the supporting substrate 101 with the oxide insulating layer 103 interposed therebetween, a gate insulating layer 208 provided over the semiconductor layer, the gate electrode 119 provided over the gate insulating layer 208, and a pair of wirings 230a and 230b which are electrically connected to impurity regions of the semiconductor layer. The pair of wirings 230a and 230b function as a source electrode and a drain electrode. Note that the semiconductor layer includes the channel region 137, and low-concentration impurity regions 214 and 215 and the high-concentration impurity regions 133 and 135 (also collectively referred to simply as impurity regions) which are provided so that the channel region 137 is sandwiched therebetween.

In this embodiment, sidewall insulating layers 218 and 219 are provided on side surfaces of the gate electrode 119. Further, in regions of the semiconductor layer which overlap with the sidewall insulating layers 218 and 219 when seen in a direction perpendicular to a surface of the supporting substrate 101, the low-concentration impurity regions 214 and 215 are included. Further, insulating layers 140 and 142 are provided so as to cover the transistor 260. The pair of wirings 230a and 230b are electrically connected to the high-concentration impurity regions 133 and 135 through contact holes formed in the insulating layers 140 and 142. Note that the sidewall insulating layers 218 and 219 are not formed in some cases for integration of the transistor 260 or the like.

The insulating layers 140 and 142 can be formed by performing a planarization treatment on the insulating layers 139 and 141 described in Embodiment 4. As a planarization treatment, an etching treatment (e.g., dry etching or wet etching), a polishing treatment (e.g., CMP), or the like is performed.

The transistor 280 illustrated in FIGS. 10A to 10C includes an oxide semiconductor layer 240, a pair of wirings 244a and 244b which are in contact with the oxide semiconductor layer 240, a gate insulating layer 245 covering the oxide semiconductor layer 240 and the pair of wirings 244a and 244b, and a gate electrode 247 overlapping with the oxide semiconductor layer 240 with the gate insulating layer 245 interposed therebetween. The pair of wirings 244a and 244b function as a source electrode and a drain electrode.

As the oxide semiconductor layer 240, a four-component metal oxide such as an In—Sn—Ga—Zn—O-based metal oxide, a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide, a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide can be used. Here, an n-component metal oxide contains n kinds of metal oxides. Note that it is preferable that the energy gap of the metal oxide which can form the oxide semiconductor layer 240 be 2 eV or more, preferably 2.5 eV or more, more preferably 3 eV or more. In this manner, off-state current of a transistor can be reduced by using a metal oxide having a wide band gap.

The oxide semiconductor layer 240 is formed by a sputtering method, a coating method, a printing method, a pulsed laser evaporation method, or the like, and is preferably heated so that hydrogen contained in the oxide semiconductor layer 240 is removed.

In FIGS. 10A to 10C, when planarity of the insulating layers 140 and 142 over which the oxide semiconductor layer 240 is formed is improved, the oxide semiconductor layer 240 can have a uniform thickness, which lead to improvement in the characteristics of the transistor 280. Note that the channel length is as small as 0.8 μm or 3 μm, for example.

The pair of wirings 244a and 244b can be formed in a manner similar to that of the pair of wirings 143 and 145 and the pair of wirings 147 and 149 which are described in Embodiment 4. Further, a wiring 242a connected to the wiring 230a and a wiring 242b connected to the wiring 230b are formed in the same step as the pair of wirings 244a and 244b.

The gate insulating layer 245 can be formed in a manner similar to that of the insulating layer 111 described in Embodiment 4.

The gate electrode 247 can be formed in a manner similar to that of the gate electrodes 119 and 121 described in Embodiment 4. Note that an electrode 248 of a capacitor 265 is formed in the same step as the gate electrode 247.

The capacitor 265 illustrated in FIGS. 10A to 10C includes one of the pair of wirings 244a and 244b, the gate insulating layer 245 serving as a dielectric, and the electrode 248.

An insulating layer 250 is provided over the transistor 280 and the capacitor 265. The insulating layer 250 can be formed in a manner similar to that of the insulating layer 111 described in Embodiment 4.

Since a transistor including an oxide semiconductor layer has extremely low off current, data can be retained for an extremely long time by using such a transistor including an oxide semiconductor layer. In other words, power consumption can be adequately reduced because refresh operation becomes unnecessary or the frequency of refresh operation can be extremely low. Moreover, stored data can be retained for a long time even when power is not supplied.

FIG. 10C is a circuit diagram of a memory element. Note that in the circuit diagram, in some cases, "OS" is written beside a transistor in order to indicate that the transistor includes an oxide semiconductor layer.

In FIG. 10C, a first wiring (a 1st Line) is electrically connected to one of the pair of wirings of the transistor 260, and a second wiring (a 2nd Line) is electrically connected to the other of the pair of wirings of the transistor 260. A third wiring (a 3rd Line) is electrically connected to one of the pair of wirings of the transistor 280, and a fourth wiring (a 4th Line) is electrically connected to the gate electrode of the transistor 280. The gate electrode of the transistor 260, the other of the pair of wirings of the transistor 280, and one electrode of the capacitor 265 are electrically connected to one another. Further, a fifth wiring (a 5th line) and the other electrode of the capacitor 265 are electrically connected to each other.

The memory device in FIG. 10C can write, retain, and read data as described below, utilizing a characteristic in which the potential of the gate electrode of the transistor 260 can be held.

Firstly, writing and retaining of data will be described. First, the potential of the fourth wiring is set to a potential at which the transistor 280 is turned on, so that the transistor 280 is turned on. Thus, the potential of the third wiring is applied to the gate electrode of the transistor 260 and the capacitor 265. In other words, a predetermined charge is supplied to the gate electrode of the transistor 260 (writing). Here, charge for supply of a potential level or charge for supply of a different potential level (hereinafter referred to as Low level charge and High level charge) is given. After that, the potential of the fourth wiring is set to a potential at which the transistor 280 is turned off, so that the transistor 280 is turned off. Thus, the charge given to the gate electrode of the transistor 260 is held (retaining).

The off-state current of the transistor 280 is extremely low. Specifically, the value of the off-state current (here, current per micrometer of channel width) is less than or equal to 100 zA/μm (1 zA (zeptoampere) is $1 \times 10^{-21}$ A), preferably less than or equal to 10 zA/μm. Thus, the charge of the gate electrode of the transistor 260 can be retained for a long time.

Next, description is made on reading of data. By supplying an appropriate potential (reading potential) to the fifth wiring while a predetermined potential (constant potential) is supplied to the first wiring, the potential of the second wiring varies depending on the amount of charge retained in the gate electrode of the transistor 260. This is because in general, when the transistor 260 is an n-channel transistor, an apparent threshold voltage $V_{th\_H}$ in the case where High level charge is given to the gate electrode of the transistor 260 is lower than an apparent threshold voltage $V_{th\_L}$ in the case where Low level charge is given to the gate electrode of the transistor 260. Here, an apparent threshold voltage refers to the potential of the fifth wiring, which is needed to turn on the transistor 260. Thus, the potential of the fifth wiring is set to a potential $V_0$ intermediate between $V_{th\_H}$ and $V_{th\_L}$, whereby charge given to the gate electrode of the transistor 260 can be determined. For example, in the case where High level charge is given in writing, when the potential of the fifth wiring is set to $V_0(>V_{th\_H})$, the transistor 260 is turned on. In the case where Low level charge is given in writing, even when the potential of the fifth wiring is set to $V_0(<V_{th\_L})$, the transistor 260 remains in an off state. Therefore, the retained data can be read by the potential of the second wiring.

This embodiment can be combined with any of the Embodiments 1 to 4.

Example 1

In this example, an edge portion of a semiconductor layer transferred to a supporting substrate on which laser light irradiation is performed, an edge portion of the semiconductor layer transferred to the supporting substrate on which laser light irradiation is not performed, and peeling of the edge portions of the semiconductor layer are described with reference to FIGS. 1A to 1G, FIGS. 11A and 11B, FIGS. 12A and 12B, FIGS. 13A and 13B, and FIG. 14.

First, a cleaned non-alkali glass substrate (product name: EAGLE XG (registered trademark)) was prepared as the supporting substrate 51 (see FIG. 1A).

Then, a single crystal silicon substrate as the semiconductor substrate 53 was cleaned and then heated in an atmosphere containing oxygen and hydrogen chloride at 950° C., so that the oxide insulating layer 57 was formed. Here, as the oxide insulating layer 57, a silicon oxide layer with a thickness of 100 nm was formed.

Subsequently, the embrittled region 55 was formed in the semiconductor substrate 53 (see FIG. 1B). Here, hydrogen or a hydrogen ion was implanted to the semiconductor substrate 53 with the dosage of $2.7 \times 10^{16}$ cm$^2$, an accelerating voltage of 50 kV, and a current density of 6.35 μA/cm$^2$.

Then, as illustrated in FIG. 1C, the semiconductor substrate 53 and the supporting substrate 51 are bonded to each other with the oxide insulating layer 57 interposed therebetween.

After that, a heat treatment was performed, so that the semiconductor substrate 53 was cleaved at the embrittled region 55. Here, the heat treatment was performed at 200° C.

for two hours and then at 600° C. for two hours; the semiconductor layer 59 was transferred to the supporting substrate 51 with the oxide insulating layer 61 interposed therebetween.

Subsequently, as illustrated in FIG. 1D, an edge portion of the semiconductor layer 59 was irradiated with the laser light 63. Here, a side of the semiconductor layer 59 was irradiated with laser light with a wavelength of 532 nm emitted by a continuous wave laser of 17.5 W, at a scanning rate of 35 cm/second. Note that the above conditions generate sufficient energy with which the semiconductor layer is completely melted. A region irradiated with the laser light 63 became a polycrystalline semiconductor region.

Figure 11A:
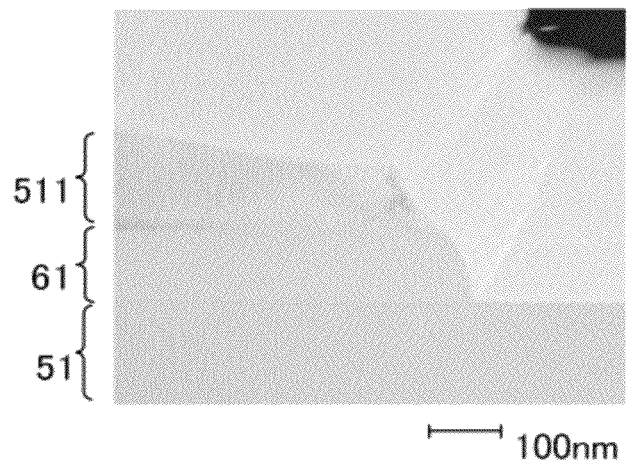
FIGS. 11A and 11B are photographs of edge portions of a semiconductor substrate which are taken with a transmission electron microscope.
Figure 11B:
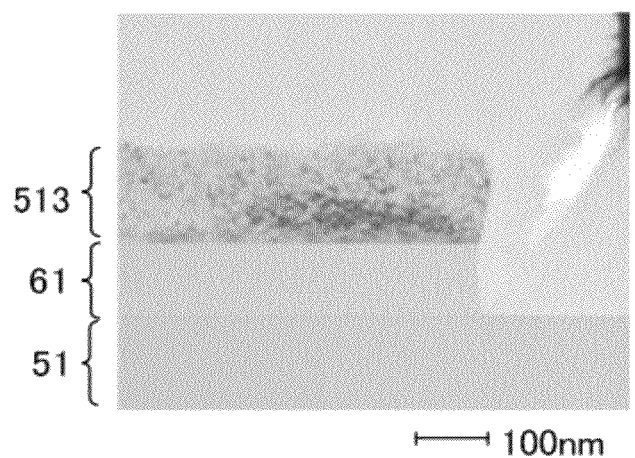

Here, results of observation of cross sections of a part which was irradiated with the laser light and a part which was not irradiated with the laser light, with a transmission electron microscope (hereinafter referred to as TEM) are shown in FIGS. 11A and 11B.

FIG. 11A shows a cross-sectional TEM image of the part irradiated with the laser light, and FIG. 11B shows a cross-sectional TEM image of the part not irradiated with the laser light. In FIG. 11A, the oxide insulating layer 61 was provided over and in close contact with the supporting substrate 51, and a polycrystalline semiconductor region 511 which was formed by laser light irradiation was provided over the oxide insulating layer 61. Further, in FIG. 11B, the oxide insulating layer 61 was provided over and in close contact with the supporting substrate 51, and a semiconductor layer 513 which was not irradiated with the laser light was provided over the oxide insulating layer 61.

Subsequently, as illustrated in FIG. 1F, the native oxide layer 69 over the surface of the semiconductor layer 59 was removed. Here, the native oxide layer 69 over the semiconductor layer 59 was removed with the use of hydrofluoric acid as an etchant.

Figure 12A:
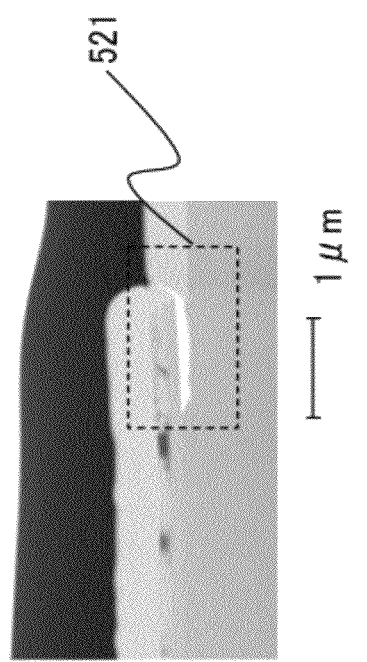
FIGS. 12A and 12B are photographs of an edge portion of a semiconductor substrate which are taken with a transmission electron microscope.
Figure 12B:
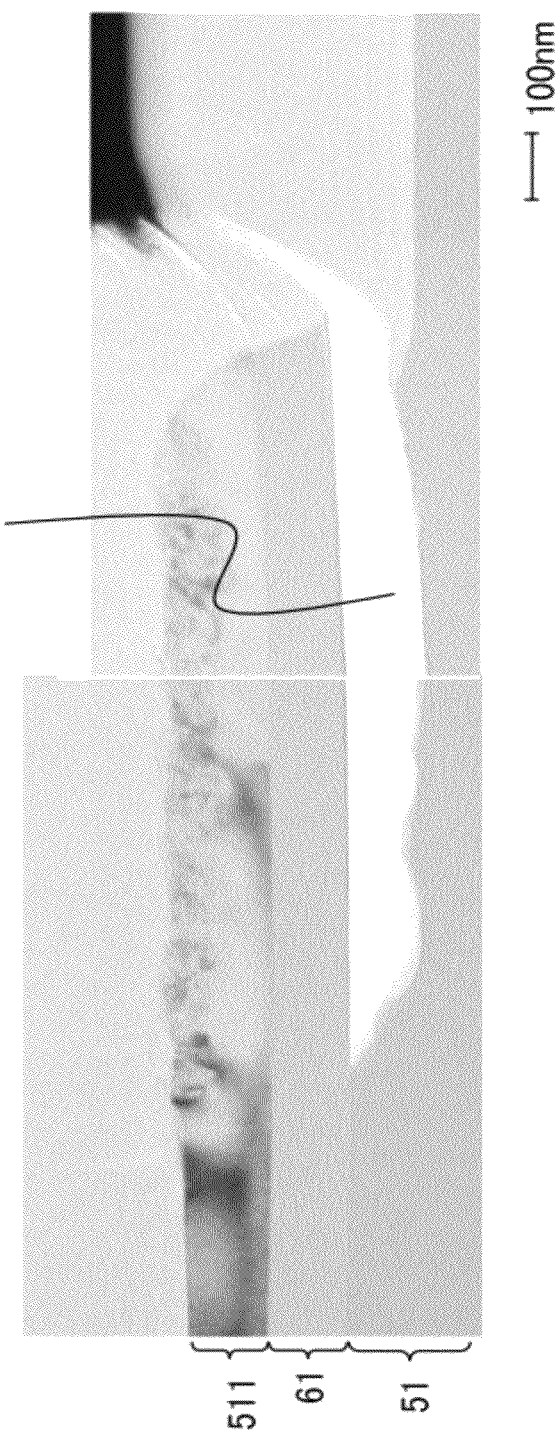
Figure 13A:
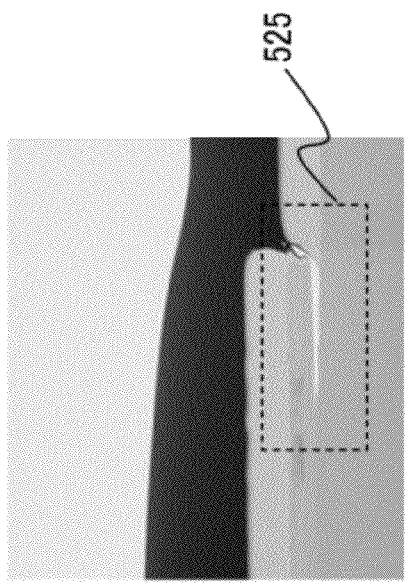
FIGS. 13A and 13B are photographs of an edge portion of a semiconductor substrate which are taken with a transmission electron microscope.
Figure 13B:
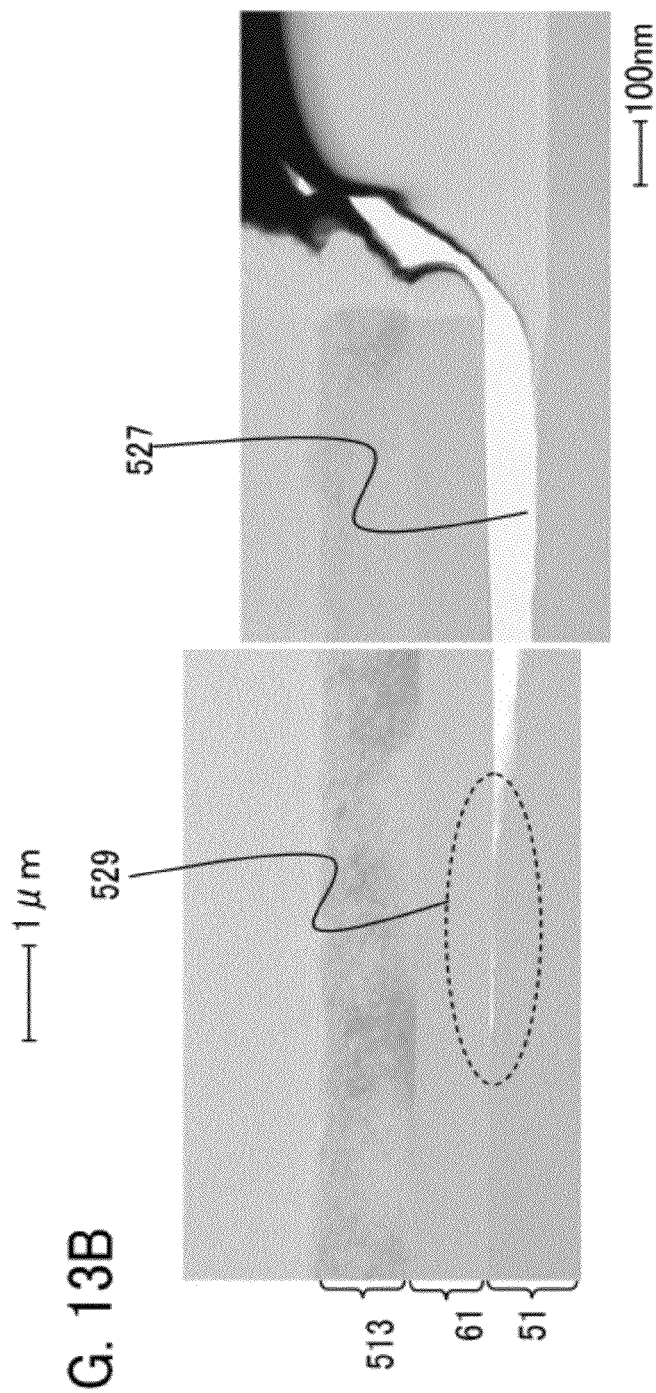

Here, results of observation of the cross sections of the part irradiated with the laser light and the part not irradiated with the laser light, after removal of the native oxide layer 69 with a TEM are shown in FIGS. 12A and 12B and FIGS. 13A and 13B. FIGS. 12A and 12B show cross-sectional TEM images of the part irradiated with the laser light, and FIGS. 13A and 13B show cross-sectional TEM images of the part not irradiated with the laser light.

FIG. 12A is the cross-sectional TEM image of the edge portion of the semiconductor layer which was transferred to the supporting substrate 51 with the oxide insulating layer 61 interposed therebetween. An enlarged view of a part that is surrounded by a dashed line 521 in FIG. 12A is shown in FIG. 12B. Note that FIG. 12B is formed by connecting two images, where the images are a little separated as a result of position adjustment. A void 523 is formed at an interface between the supporting substrate 51 and the oxide insulating layer 61. Formation of the void 523 resulted from melting of glass of the supporting substrate in the step of removing the native oxide layer 69.

FIG. 13A is the cross-sectional TEM image of the edge portion of the semiconductor layer which was transferred to the supporting substrate 51 with the oxide insulating layer 61 interposed therebetween. An enlarged view of a part that is surrounded by a dashed line 525 in FIG. 13A is shown in FIG. 13B. Note that FIG. 13B is formed by connecting two images, where the images are a little separated as a result of position adjustment. A void 527 is formed at an interface between the supporting substrate 51 and the oxide insulating layer 61. Formation of the void 527 resulted from melting of glass of the supporting substrate in the step of removing the native oxide layer 69. As compared to the void 523 shown in FIG. 12B, the void 527 at the interface between the supporting substrate 51 and the oxide insulating layer 61 is thin as denoted by a dashed line 529 but proceeded to an inner part.

When adhesiveness at the interface between the supporting substrate and the oxide insulating layer is high, the etchant less enters the interface between the oxide insulating layer and the supporting substrate even if the supporting substrate is melted by the etchant; accordingly, melting of the supporting substrate does not proceed so much as shown in FIG. 12B. On the other hand, when the adhesiveness between the supporting substrate and the oxide insulating layer is low, a gap is formed between the supporting substrate and the oxide insulating layer. The etchant enters the gap and the supporting substrate is further etched. As a result, edge portions of the oxide insulating layer and the semiconductor layer are lifted and a gap is formed; thus, a void is formed in an inner part in the part not irradiated with laser light, as shown in FIG. 13B.

Next, the adhesiveness between the supporting substrate 51 and the oxide insulating layer 57 was examined. Here, a kapton tape (registered trademark) was attached to each of the region irradiated with the laser light 63 and the region not irradiated with the laser light 63, and was then peeled off; adhesiveness in each region was examined.

Figure 14:
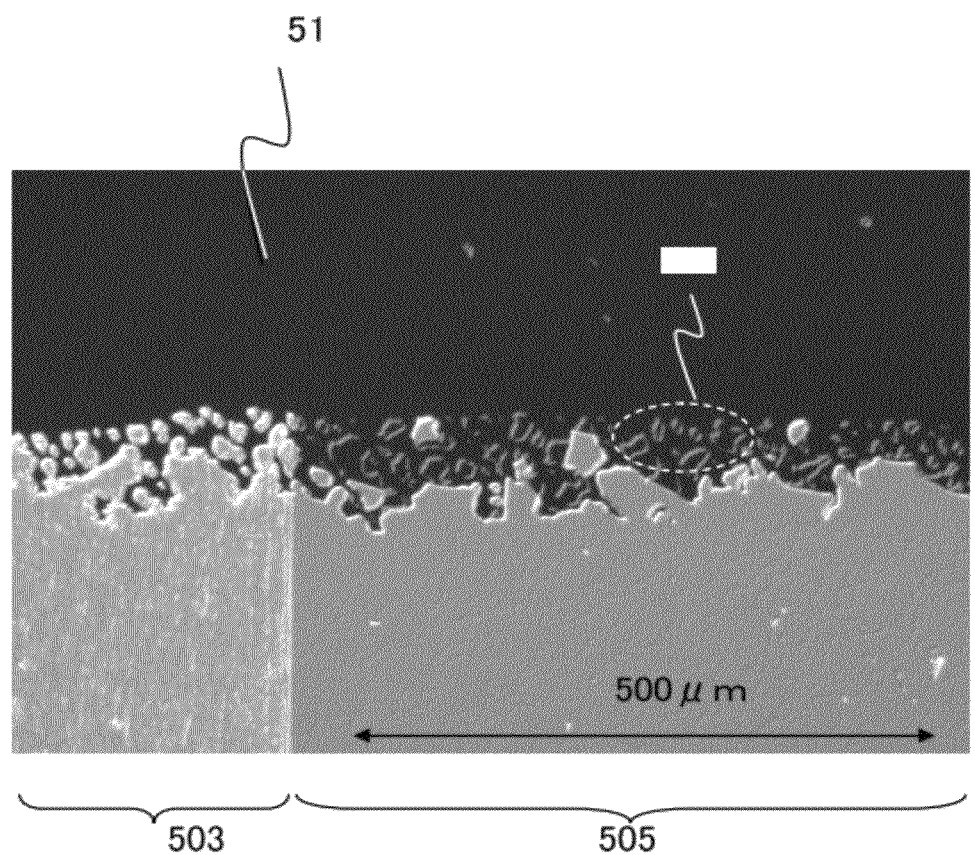
FIG. 14 is a photograph of an edge portion of a semiconductor substrate which is taken with an optical microscope.

FIG. 14 shows an image of an edge portion of the supporting substrate 51 after examination of the adhesiveness, which was taken with an optical microscope. In a part 503 irradiated with the laser light, peeling of the polycrystalline semiconductor region was not observed after peeling of the kapton tape.

On the other hand, in a part 505 which was not irradiated with the laser light, the oxide insulating layer and the semiconductor layer were partly peeled, and a region (e.g., a region surrounded by a dashed line 509) was observed in which a projected portion of the supporting substrate which was not melted by the etchant was exposed. This is because the oxide insulating layer and the semiconductor layer were partly peeled at the time of peeling the kapton tape off because of low adhesiveness between the supporting substrate and the oxide insulating layer, so that the projected portion of the supporting substrate was exposed.

From the above, it can be known that, by irradiating an edge portion of a semiconductor layer transferred to a supporting substrate with laser light, adhesiveness between the supporting substrate and an oxide insulating layer is increased and lifting and peeling of the edge portion of the semiconductor layer can be prevented.

This application is based on Japanese Patent Application serial no. 2010-254168 filed with Japan Patent Office on Nov. 12, 2010, the entire contents of which are hereby incorporated by reference.

What is claimed is:

1. A method for manufacturing an SOI substrate comprising:
preparing a semiconductor substrate including an embrittled region;
forming an oxide insulating layer over the semiconductor substrate;
bonding the semiconductor substrate and a supporting substrate with the oxide insulating layer interposed therebetween;
cleaving the semiconductor substrate at the embrittled region so that a semiconductor layer is provided on the supporting substrate with the oxide insulating layer interposed therebetween;
irradiating an edge portion of the semiconductor layer with first laser light so that a polycrystalline semiconductor region is formed in the edge portion of the semiconductor layer; and removing an oxide layer over a surface of the semiconductor layer after irradiating the edge portion of the semiconductor layer with the first laser light.

2. The method for manufacturing the SOI substrate according to claim 1, further comprising a step of irradiating the semiconductor layer with second laser light after removing the oxide layer.

3. The method for manufacturing the SOI substrate according to claim 1, wherein the first laser light has energy with which the semiconductor layer is completely melted.

4. The method for manufacturing the SOI substrate according to claim 2, wherein the second laser light has energy with which the semiconductor layer is partially melted.

5. The method for manufacturing the SOI substrate according to claim 1,
wherein the supporting substrate is a glass substrate, and
wherein the oxide layer is a silicon oxide layer.

6. The method for manufacturing the SOI substrate according to claim 1, wherein the oxide layer is removed by wet etching.

7. The method for manufacturing the SOI substrate according to claim 1, wherein the embrittled region is formed by irradiating the semiconductor substrate with an ion.

8. The method for manufacturing the SOI substrate according to claim 1, wherein the embrittled region is formed by anodizing a part of the semiconductor substrate.

9. The method for manufacturing the SOI substrate according to claim 1,
wherein the step of irradiating the edge portion results in a region which is unexposed to the first laser light in the semiconductor layer, and
wherein the region is surrounded by the edge portion.

10. A method for manufacturing an SOI substrate comprising:
preparing a semiconductor substrate including an embrittled region;
forming an oxide insulating layer over the semiconductor substrate;
bonding the semiconductor substrate and a supporting substrate with the oxide insulating layer interposed therebetween;
cleaving the semiconductor substrate at the embrittled region so that a semiconductor layer is provided on the supporting substrate with the oxide insulating layer interposed therebetween;
irradiating an edge portion of the semiconductor layer with first laser light so that adhesiveness between the supporting substrate and the oxide insulating layer in the edge portion of the semiconductor layer is increased; and
removing an oxide layer over a surface of the semiconductor layer after irradiating the edge portion of the semiconductor layer with the first laser light.

11. The method for manufacturing the SOI substrate according to claim 10, further comprising a step of irradiating the semiconductor layer with second laser light after removing the oxide layer.

12. The method for manufacturing the SOI substrate according to claim 10, wherein the first laser light has energy with which the semiconductor layer is completely melted.

13. The method for manufacturing the SOI substrate according to claim 11, wherein the second laser light has energy with which the semiconductor layer is partially melted.

14. The method for manufacturing the SOI substrate according to claim 10,
wherein the supporting substrate is a glass substrate, and
wherein the oxide layer is a silicon oxide layer.

15. The method for manufacturing the SOI substrate according to claim 10, wherein the oxide layer is removed by wet etching.

16. The method for manufacturing the SOI substrate according to claim 10, wherein the embrittled region is formed by irradiating the semiconductor substrate with an ion.

17. The method for manufacturing the SOI substrate according to claim 10, wherein the embrittled region is formed by anodizing a part of the semiconductor substrate.

18. The method for manufacturing the SOI substrate according to claim 10,
wherein the step of irradiating the edge portion results in a region which is unexposed to the first laser light in the semiconductor layer, and
wherein the region is surrounded by the edge portion.

* * * * *